(12) United States Patent
Ritter et al.

(10) Patent No.: US 7,177,137 B2
(45) Date of Patent: Feb. 13, 2007

(54) PLATED TERMINATIONS

(75) Inventors: Andrew P. Ritter, Surfside Beach, SC (US); Robert Heistand, II, Myrtle Beach, SC (US); John L. Galvagni, Surfside Beach, SC (US); Sriram Dattaguru, Myrtle Beach, SC (US); Jeffrey A. Horn, Myrtle Beach, SC (US); Richard A. Ladew, Pawleys Island, SC (US)

(73) Assignee: AVX Corporation, Myrtle Beach, SC (US)

( * ) Notice: Subject to any disclaimer, the term of this patent is extended or adjusted under 35 U.S.C. 154(b) by 40 days.

(21) Appl. No.: 10/818,951

(22) Filed: Apr. 6, 2004

(65) Prior Publication Data

US 2004/0257748 A1    Dec. 23, 2004

Related U.S. Application Data

(63) Continuation-in-part of application No. 10/632,514, filed on Aug. 1, 2003, and a continuation-in-part of application No. 10/409,023, filed on Apr. 8, 2003.

(60) Provisional application No. 60/372,673, filed on Apr. 15, 2002.

(51) Int. Cl.
*H01G 4/228* (2006.01)

(52) U.S. Cl. ................ 361/306.3; 361/308.1; 361/310; 361/321.2; 29/25.41

(58) Field of Classification Search ........ 361/303–305, 361/306.1, 306.2, 306.3, 308.1, 310–313, 361/321.1, 321.2, 321.5, 301.4, 309, 322, 361/329

See application file for complete search history.

(56) References Cited

U.S. PATENT DOCUMENTS 369,545 A    9/1887   Monroe et al.

(Continued)

FOREIGN PATENT DOCUMENTS

EP    0351343    1/1990

(Continued)

OTHER PUBLICATIONS

Translated Abstract of Japanese Patent No. 1-313804 cited above.

(Continued)

*Primary Examiner*—Anthony Dinkins
(74) *Attorney, Agent, or Firm*—Dority & Manning, P.A.

(57) ABSTRACT

A multilayer electronic component includes a plurality of dielectric layers interleaved with a plurality of internal electrode elements and a plurality of internal anchor tabs. Portions of the internal electrode elements and anchor tabs are exposed along the periphery of the electronic component in one or more aligned columns. Each exposed portion is within a predetermined distance from other exposed portions in a given column such that bridged terminations may be formed by depositing one or more plated termination materials over selected of the respectively aligned columns. Internal anchor tabs may be provided and exposed in pre-arranged relationships with other exposed conductive portions to help nucleate metallized plating material along the periphery of a device. External anchor tabs or lands may be provided to form terminations that extend to top and/or bottom surfaces of the device. Selected of the conductive elements may be formed by a finite volume percentage of ceramic material for enhanced durability, and external lands may be thicker than internal conductive elements and/or may also be embedded in top and/or bottom component surfaces. A variety of potential internal electrode configurations are possible including ones configured for orientation-insensitive component mounting and for high density peripheral termination interdigitated capacitors.

71 Claims, 22 Drawing Sheets

U.S. PATENT DOCUMENTS

| | | | |
|---|---|---|---|
| 3,258,898 A | 7/1966 | Garibotti | |
| 3,448,355 A | 6/1969 | Ahearn, Jr. et al. | |
| 3,665,267 A | 5/1972 | Acello | |
| 3,809,973 A | 5/1974 | Hurley | |
| 3,898,541 A | 8/1975 | Weller | |
| 3,988,498 A | 10/1976 | Maher | |
| 3,992,761 A | 11/1976 | McElroy et al. | |
| 4,241,378 A | 12/1980 | Dorrian | |
| 4,266,265 A | 5/1981 | Maher | |
| 4,574,329 A | 3/1986 | Eijkelenkamp et al. | |
| 4,661,884 A | 4/1987 | Seaman | |
| 4,729,058 A | 3/1988 | Gupta et al. | |
| 4,811,162 A | 3/1989 | Maher et al. | |
| 4,811,164 A | 3/1989 | Ling et al. | |
| 4,819,128 A | 4/1989 | Florian et al. | |
| 4,831,494 A | 5/1989 | Arnold et al. | |
| 4,852,227 A | 8/1989 | Burks | |
| 4,919,076 A | 4/1990 | Lutz et al. | |
| 5,021,921 A | 6/1991 | Sano et al. | |
| 5,159,300 A | 10/1992 | Nakamura et al. | |
| 5,226,382 A | 7/1993 | Braden | |
| 5,251,094 A | 10/1993 | Amano et al. | |
| 5,311,651 A | 5/1994 | Kim et al. | |
| 5,369,545 A | 11/1994 | Bhattacharyya et al. | |
| 5,412,357 A | 5/1995 | Nakamura et al. | |
| 5,493,266 A | 2/1996 | Sasaki et al. | |
| 5,576,053 A | 11/1996 | Senda et al. | |
| 5,753,299 A | 5/1998 | Garcia et al. | |
| 5,770,476 A | 6/1998 | Stone | |
| 5,863,331 A | 1/1999 | Braden et al. | |
| 5,870,273 A | 2/1999 | Sogabe et al. | |
| 5,880,011 A | 3/1999 | Zablotny et al. | |
| 5,880,925 A * | 3/1999 | Dupré et al. | 361/303 |
| 5,944,897 A | 8/1999 | Braden | |
| 5,985,414 A | 11/1999 | Fukuda et al. | |
| 6,040,755 A | 3/2000 | Abe et al. | |
| 6,141,846 A | 11/2000 | Miki | |
| 6,159,768 A | 12/2000 | Ahn | |
| 6,188,565 B1 | 2/2001 | Naito et al. | |
| 6,191,932 B1 | 2/2001 | Kuroda et al. | |
| 6,214,685 B1 | 4/2001 | Clinton et al. | |
| 6,232,144 B1 | 5/2001 | McLoughlin | |
| 6,243,253 B1 | 6/2001 | DuPre et al. | |
| 6,266,229 B1 | 7/2001 | Naito et al. | |
| 6,292,351 B1 * | 9/2001 | Ahiko et al. | 361/306.3 |
| 6,310,757 B1 | 10/2001 | Tuzuki et al. | |
| 6,311,390 B1 | 11/2001 | Abe et al. | |
| 6,362,723 B1 | 3/2002 | Kawase | |
| 6,370,010 B1 * | 4/2002 | Kuroda et al. | 361/306.1 |
| 6,380,619 B2 | 4/2002 | Ahiko et al. | |
| 6,496,355 B1 | 12/2002 | Galvagni et al. | |
| 6,525,395 B1 | 2/2003 | Kawase | |
| 6,594,136 B2 | 7/2003 | Kuroda et al. | |
| 6,621,682 B1 | 9/2003 | Takakuwa et al. | |
| 6,661,638 B2 | 12/2003 | Jackson et al. | |
| 6,729,003 B2 | 5/2004 | Yokoyama et al. | |
| 6,743,479 B2 | 6/2004 | Kanoh et al. | |
| 6,765,781 B2 * | 7/2004 | Togashi | 361/306.3 |
| 2003/0011963 A1 | 1/2003 | Ahiko et al. | |

FOREIGN PATENT DOCUMENTS

| | | |
|---|---|---|
| EP | 0379066 A3 | 7/1990 |
| GB | 1535662 A | 12/1978 |
| GB | 1540403 | 2/1979 |
| GB | 2326976 A | 1/1999 |
| GB | 2334377 A | 8/1999 |
| GB | 2389708 A | 12/2003 |
| JP | 01313804 | 12/1989 |
| JP | 6168845 | 6/1994 |
| JP | 2164257 | 6/2002 |
| WO | WO 0203405 A1 | 1/2002 |

OTHER PUBLICATIONS

Translated Abstract of Japanese Patent No. 6168845 cited above.

Translated Abstract of Japanese Patent No. 2164257 cited above.

Hung Van Trinh, "An Electrodeposition Method for Terminals of Multilayer Ceramic Capacitors," Mar. 23, 2002 (a thesis submitted in partial satisfaction of the requirements for the degree Master of Science in Materials Science and Engineering, University of California-San Diego).

European Search Report for Application No. GB0308656.8 dated May 6, 2004.

European Search Report for Application No. GB0405993.7 dated Jul. 26, 2004.

Hung Van Trinh and Jan B. Talbot, "An Electrodeposition Method for Terminals of Multilayer Ceramic Capacitors" CARTS 2003: 23rd Capacitor and Resistor Technology Symposium Mar. 31-Apr. 3, 2003.

Hung Van Trinh and Jan B. Talbot, "Electrodeposition Method for Terminals of Multilayer Ceramic Capacitors," Jun. 2003, vol. 86, No. 6, Journal of the American Ceramic Society.

Search Report under Section 17 for Application No. GB0425961.0.

Search Report under Section 17 for Application No. GB0425963.6.

European Search Report for Application No. GB0308656.8 dated Sep. 8, 2005.

\* cited by examiner

PLATED TERMINATIONS

PRIORITY CLAIMS

This application claims the benefit of priority as a continuation-in-part application of previously filed U.S. Utility Patent Application entitled "PLATED TERMINATIONS", filed Aug. 1, 2003 and assigned U.S. Ser. No. 10/632,514, as well as U.S. Utility Patent Application entitled "PLATED TERMINATIONS" filed Apr. 8, 2003 and assigned U.S. Ser. No. 10/409,023, which applications respectively claim priority to U.S. Provisional Patent Application entitled "PLATED TERMINATIONS," filed Apr. 15, 2002 and assigned U.S. Ser. No. 60/372,673, and which are all incorporated herein by reference for all purposes.

BACKGROUND OF THE INVENTION

The present subject matter generally concerns improved termination features for multilayer electronic components, and more particularly relates to plated terminations for multilayer electronic components, such as capacitors, resistors, inductors, etc. or for integrated passive components. The subject termination designs utilize selective arrangements of internal and/or external electrode tabs to facilitate the formation of plated electrical connections. The external connections are preferably made whereby the provision of typical thick film termination stripes is eliminated or greatly simplified.

Many modern electronic components are packaged as monolithic devices, and may comprise a single component or multiple components within a single chip package. One specific example of such a monolithic device is a multilayer capacitor or capacitor array, and of particular interest with respect to the disclosed technology are multilayer capacitors with interdigitated internal electrode layers and corresponding electrode tabs. Examples of multilayer capacitors that include features of interdigitated capacitor (IDC) technology can be found in U.S. Pat. No. 5,880,925 (DuPré et al.) and U.S. Pat. No. 6,243,253 B1 (DuPré et al.). Other monolithic electronic components correspond to devices that integrate multiple passive components into a single chip structure. Such an integrated passive component may provide a selected combination of resistors, capacitors, inductors and/or other passive components that are formed in a multilayered configuration and packaged as a monolithic electronic device.

Selective terminations are often required to form electrical connections for various monolithic electronic components. Multiple terminations are needed to provide electrical connections to the different electronic components of an integrated monolithic device. Multiple terminations are also often used in conjunction with IDC's and other multilayer arrays in order to reduce undesirable inductance levels. One exemplary way that multiple terminations have been formed in multilayer components is by drilling vias through selected areas of a chip structure and filling the vias with conductive material such that an electrical connection is formed among selected electrode portions of the device.

Another way of forming external terminations for the subject devices is to apply a thick film stripe of silver or copper in a glass matrix to exposed portions of internal electrode layers, and subsequently plating additional layers of metal over the termination stripes such that a part is solderable to a substrate. An example of an electronic component with external electrodes formed by fired terminations and metal films plated thereon is disclosed in U.S. Pat. No. 5,021,921 (Sano et al.). The application of terminations is often hard to control and can become problematic with reduction in chip sizes. U.S. Pat. No. 6,232,144 B1 (McLoughlin) and U.S. Pat. No. 6,214,685 B1 (Clinton et al.) concern methods for forming terminations on selected regions of an electronic device.

The ever-shrinking size of electronic components makes it quite difficult to print termination stripes in a predetermined area with required precision. Thick film termination stripes are typically applied with a machine that grabs a chip and applies selective terminations with specially designed and/or engraved wheels. U.S. Pat. No. 5,944,897 (Braden), U.S. Pat. No. 5,863,331 (Braden et al.), U.S. Pat. No. 5,753,299 (Garcia et al.), and U.S. Pat. No. 5,226,382 (Braden) disclose mechanical features and steps related to the application of termination stripes to a chip structure. Reduced component size or an increased number of termination contacts for an electronic chip device may cause the resolution limits of typical termination machines to become maxed out.

Other problems that can arise when trying to apply selective terminations include shifting of the termination lands, mispositioning of terminations such that internal electrode tabs are exposed or missed entirely, and missing wrap-around termination portions. Yet further problems may be caused when too thin a coating of the paint-like termination material is applied or when one portion of termination coating smears into another causing shorted termination lands. These and other concerns surrounding the provision of electrical termination for monolithic devices create a need to provide inexpensive and effective termination features for electronic chip components.

In light of component miniaturization and concerns with providing terminations that do not short together, especially when positioning multiple components in proximity on a circuit board, U.S. Pat. No. 6,380,619 (Ahiko et al.) provides a chip type electronic component having external electrodes that are spaced at predetermined distances from side surfaces of a ceramic substrate. More particularly, electronic components having three-sided terminations as opposed to more conventional five-sided terminations are disclosed. Such components with three-sided terminations are more easily provided in an adjacent relationship with one another without shorting together distinct component terminations. Some embodiments disclosed in Ahiko et al. include electroplated films applied to the exposed portions of individual electrodes.

Yet another known option related to termination application involves aligning a plurality of individual substrate components to a shadow mask. Parts can be loaded into a particularly designed fixture, such as that disclosed in U.S. Pat. No. 4,919,076 (Lutz et al.), and then sputtered through a mask element. This is typically a very expensive manufacturing process, and thus other effective yet more cost efficient termination provisions may be desirable.

U.S. Pat. No. 5,880,011 (Zablotny et al.), U.S. Pat. No. 5,770,476 (Stone), U.S. Pat. No. 6,141,846 (Miki), and U.S. Pat. No. 3,258,898 (Garibotti), respectively deal with aspects of the formation of terminations for various electronic components.

Additional background references that address methodology for forming multilayer ceramic devices include U.S. Pat. No. 4,811,164 (Ling et al.), U.S. Pat. No. 4,266,265 (Maher), U.S. Pat. No. 4,241,378 (Dorrian), and U.S. Pat. No. 3,988,498 (Maher).

While various aspects and alternative features are known in the field of electronic components and terminations therefor, no one design has emerged that generally addresses all of the issues as discussed herein. The disclosures of all the foregoing United States patents are hereby fully incorporated into this application by reference thereto.

BRIEF SUMMARY OF THE INVENTION

The present subject matter recognizes and addresses various of the foregoing shortcomings, and others concerning certain aspects of electrical terminations and related technology. Thus, broadly speaking, a principal object of the presently disclosed technology is improved termination features for electronic components. More particularly, the disclosed termination features are plated and designed to eliminate or greatly simplify thick-film stripes that are typically printed along portions of a monolithic device for termination purposes.

Another principal object of the presently disclosed technology is to offer a way to guide the formation of plated terminations through the provision of internal electrode elements and the optional placement of additional anchor tabs. Both internal electrode elements and additional anchor tabs can facilitate the formation of secure and reliable external plating. Anchor tabs, which typically provide no internal electrical connections, may be provided for enhanced external termination connectivity, better mechanical integrity and deposition of plating materials.

Yet another principal object of the present subject matter is to provide termination features for electronic components whereby typical thick-film termination stripes are eliminated or simplified, and only plated terminations are needed to effect many of the external electrode connections for a given component. Plated materials in accordance with the disclosed technology may comprise metallic conductors, resistive materials, and/or semi-conductive materials.

A still further principal object of the subject termination technology is that termination features can be used in accordance with a variety of multilayer monolithic devices, including, for example, low inductance ceramic capacitors and capacitor arrays, multilayer ceramic capacitors and capacitor arrays, and integrated passive components. Integrated passive components may include a select combination of resistors, capacitors, varistors, inductors, baluns, couplers, and/or other passive components.

A resultant advantage of the disclosed subject matter is that termination features for electronic components can be effected without the need for application by termination machinery, thus providing an ability to yield external terminations with resolution levels that may otherwise be unattainable. Such improved termination resolution also enables the provision of more terminations within a given component area and terminations with a much finer pitch, thus reducing over ESL values associated with such terminations.

A general object of the present technology is to provide termination features that enable an effective solder base with reduced susceptibility to solder leaching and also lowered insulation resistance. Configuration of exposed electrode portions and anchor tab portions is designed such that selected adjacent exposed tab portions are decorated with plated termination material without undesired bridging among distinct termination locations.

Yet another object of the present subject matter is that the disclosed technology can be utilized in accordance with a myriad of different termination configurations, including varied numbers and placement of external terminations. Plated terminations can be formed in accordance with a variety of different plating techniques as disclosed herein at locations that are self-determined by the provision of exposed conductive elements on the periphery of an electronic component.

A still further object of the subject plated termination technology is to facilitate the production of more inexpensive and effective electronic components in an expedient and reliable manner. One key reason why this is accomplished is that the subject termination plating process uses "batch" processing instead of individual termination.

Additional objects and advantages of the invention are set forth in, or will be apparent to those of ordinary skill in the art from, the detailed description herein. Also, it should be further appreciated by those of ordinary skill in the art that modifications and variations to the specifically illustrated, referenced, and discussed features hereof may be practiced in various embodiments and uses of the disclosed technology without departing from the spirit and scope thereof, by virtue of present reference thereto. Such variations may include, but are not limited to, substitution of equivalent means and features, or materials for those shown, referenced, or discussed, and the functional, operational, or positional reversal of various parts, features, or the like.

Still further, it is to be understood that different embodiments, as well as different presently preferred embodiments, of this invention may include various combinations or configurations of presently disclosed features or elements, or their equivalents (including combinations of features or configurations thereof not expressly shown in the figures or stated in the detailed description).

A first exemplary embodiment of the present subject matter relates to a multilayer electronic component including a plurality of dielectric layers, a plurality of internal electrode elements and a plurality of internal anchor tabs. Each respective dielectric layer is delimited laterally by edges and the plurality of internal electrode elements are interleaved among the plurality of dielectric layers such that selected portions of the internal electrode elements are exposed along at least one edge of the plurality of dielectric layers. The plurality of electrode tabs are also interleaved among the plurality of dielectric layers and exposed along selected edges of the dielectric layers.

A second exemplary embodiment of the present subject matter corresponds to a multilayer electronic component including a plurality of first dielectric layers, a plurality of internal electrode elements, a plurality of second dielectric layers, and a plurality of internal anchor tabs. Each first dielectric layer is delimited laterally by edges. The plurality of internal electrode elements are interleaved among the plurality of first dielectric layers to form an active assembly characterized by topmost and bottommost surfaces. Selected portions of the plurality of internal electrode elements extend to and are exposed along at least one edge of the plurality of first dielectric layers. The plurality of second dielectric layers are also delimited laterally be edges and are respectively provided on selected of the topmost and bottommost surfaces of the active assembly to form at least one cover layer for the multilayer electronic component. The plurality of internal anchor tabs are interleaved among selected of the first and second dielectric layers and are exposed along selected edges thereof such that exposed portions of the plurality of internal electrode elements and exposed portions of the internal anchor tabs are aligned in one or more columns at selected edges or corners of the multilayer electronic component.

In some more particular embodiments, internal conductive elements correspond to capacitor electrodes of first and second opposing polarities and at least one plated termination is formed to interface with elements of each respective polarity. Internal anchor tabs connecting to a first polarity termination are provided at a sufficient distance from the second polarity electrode elements and internal anchor tabs connecting to the second polarity termination are provided at a sufficient distance from the first polarity electrode elements to reduce the chances of such elements shorting together. In other embodiments, the second dielectric layers utilized in the cover layers of a multilayer electronic component are interleaved with common electrode elements.

In some exemplary embodiments, the electrode elements may be provided in generally rectangular, T-shaped, J-shaped, and/or U-shaped configurations. In other exemplary embodiments, the electrode elements may be provided in an interdigitated configuration with electrode tab portions extending to, for example but not limited to, one, two, or four sides of the multilayer electronic component in one or more aligned columns. The number of aligned columns (corresponding to the number of resultant terminations) may be in a range from about four (4) to about forty (40) in some embodiments and in arrange from about ten (10) to about twenty (20) in other embodiments. Exemplary pitch dimensions between exposed conductive columns (and resulting terminations) on a given component side may be between about ten (10) and thirty (30) mils.

Distances between adjacent exposed conductive portions in a given column may be specifically designed to ensure guided formation of terminations in accordance with the disclosed technology. In some embodiments, such distance between exposed conductive portions in a given column is less than about ten microns and is less than about eight microns in other embodiments. In embodiments where the device edges/corners are rounded, the distance between conductive elements in the device cover layers may incrementally decrease towards top and/or bottom surfaces of a multilayer electronic component such that a desired surface distance between exposed portions of such conductive elements remains substantially uniform.

Plated terminations in accordance with the disclosed technology may be formed over the exposed electrode elements and the exposed anchor tabs. In some embodiments, initial portions of electrolessly plated termination material (e.g., copper) are provided at respective exposed conductive portions. Such initial portions may form one or more bridged termination between adjacent exposed conductive portions. Alternatively, a substantially continuous bridged termination may be formed by plating further layers (e.g., additional copper or subsequent nickel) over the initially deposited material. An amount of diffusion may occur (such as a result of thermal treatment of the device) at the interface between the plated termination material(s) and the exposed conductive portions.

External electrode tabs, or peripheral lands, may be provided on selected top and/or bottom surfaces of a multilayer electronic component for connecting via the subject plated terminations to exposed internal electrode or internal anchor tab portions. Such external tabs/lands may often be provided with a generally greater thickness than the internal electrodes and anchor tabs for greater mechanical robustness and survivability when corner rounding processes are employed to effect generally rounded component edges for the multilayer electronic components. Survivability may also be increased by embedding external lands in the topmost and/or bottommost surfaces of the multilayer electronic components and/or by forming selected of the conductive elements (e.g., electrodes and internal and/or external anchor tabs) with a predetermined volume percentage of ceramic material.

In some exemplary embodiments of the present subject matter, terminations comprise one or more layers of plated termination material, on top of which are provided additional termination layers. One example of such a multilayer termination corresponds to an initial plated layer of copper followed by successive layers of nickel and tin, which may also be plated in accordance with presently disclosed methodologies.

Another exemplary embodiment of the present technology corresponds to a multilayer capacitor including a plurality of dielectric layers, a plurality of first conductive elements and a plurality of second conductive elements. The respective pluralities of first and second conductive elements, which are configured as opposing capacitor plates of respective first and second polarity, are interleaved among the plurality of dielectric layers. The interleaved assembly of dielectric layers, first conductive elements and second conductive elements forms a structure generally shaped as a rectangular prism characterized by opposing top and bottom surfaces and four side surfaces therebetween. Each of the first and second conductive elements is exposed on at least two adjacent side surfaces of the multilayer capacitor.

In some embodiments, each respective plurality of first and second conductive elements includes a plurality of generally T-shaped capacitor electrodes and a plurality of generally rectangular shaped anchor electrodes. One or more aligned columns of such capacitor electrodes and anchor electrodes are formed whereby each electrode element is exposed along an entire selected side surface of the multilayer capacitor and at a portion of two side surfaces adjacent to the selected side surface. The resultant configuration may yield a component with two opposing side surfaces that are equally configured for mounting the capacitor to a substrate.

In other embodiments, each of the first and second conductive elements includes a generally rectangular shaped base portion with first and second generally rectangular tab portions extending from opposite corners of the base portion. Each generally rectangular tab portion of the first and second conductive elements may be exposed along the periphery of the multilayer capacitor in one or more aligned columns. Each rectangular tab portion may be exposed at a component edge formed where two adjacent side surfaces of the multilayer capacitor come together. Rectangular tab portions of each conductive element are exposed at opposing device edges such that each of the four side surfaces of the resultant multilayer capacitor are equally configured for mounting to a substrate.

The present subject matter equally concerns methodology associated with forming multilayer electronic components in accordance with the disclosed technology. One exemplary embodiment of such methodology includes the steps of providing a plurality of electronic components, providing a plating solution and immersing the electronic components in the plating solution. The electronic components respectively include a plurality of dielectric layers selectively interleaved with a plurality of internal conductive elements. Selected portions of the internal conductive elements are exposed at locations along the periphery of each electronic component such that immersion in the plating solution enables a termination material to be deposited at selected exposed conductive portions of each electronic component.

In some more particular embodiments, the plating solution is an electroless plating solution. Additional subsequent steps may include providing an electrolytic plating solution with an electrical bias and immersing the plurality of electronic components in the electrolytic plating solution such that an additional termination material is deposited over the termination material deposited at the initial immersing step. Either initial or subsequent deposition of plating material results in one or more bridged terminations among multiple exposed conductive elements.

Another additional exemplary step in accordance with the present subject matter may include a step of cleaning selected surfaces of the electronic components, such as via chemical polishing, before immersing the components in the electroless bath solution. A still further exemplary step corresponds to a step of applying an activation material to the exposed electrode portions, such as by immersion in metallic salts, photo-patterned organometallic precursors, screen-printed or ink-jetted metallic deposition, and/or electrophoretic metallic deposition. Another exemplary step corresponds to subjecting the electronic components to mechanical abrasion to round component edges and corners, such as accomplished by harperizing with or without a media. The need or required duration of mechanical abrasion to round device edges and corners may be reduced when electronic components are diced in a V-cut fashion. Yet another exemplary step corresponds to a heating, or annealing, step to strengthen adhesion of the plated termination material to the electronic component.

Additional embodiments of the present subject matter, not necessarily expressed in this summarized section, may include and incorporate various combinations of aspects of features or parts referenced in the summarized objectives above, and/or features or parts as otherwise discussed in this application.

Those of ordinary skill in the art will better appreciate the features and aspects of such embodiments, and others, upon review of the remainder of the specification.

BRIEF DESCRIPTION OF THE SEVERAL VIEWS OF THE DRAWING

A full and enabling description of the present subject matter, including the best mode thereof, directed to one of ordinary skill in the art, is set forth in the specification, which makes reference to the appended figures, in which.

Figure 1A:
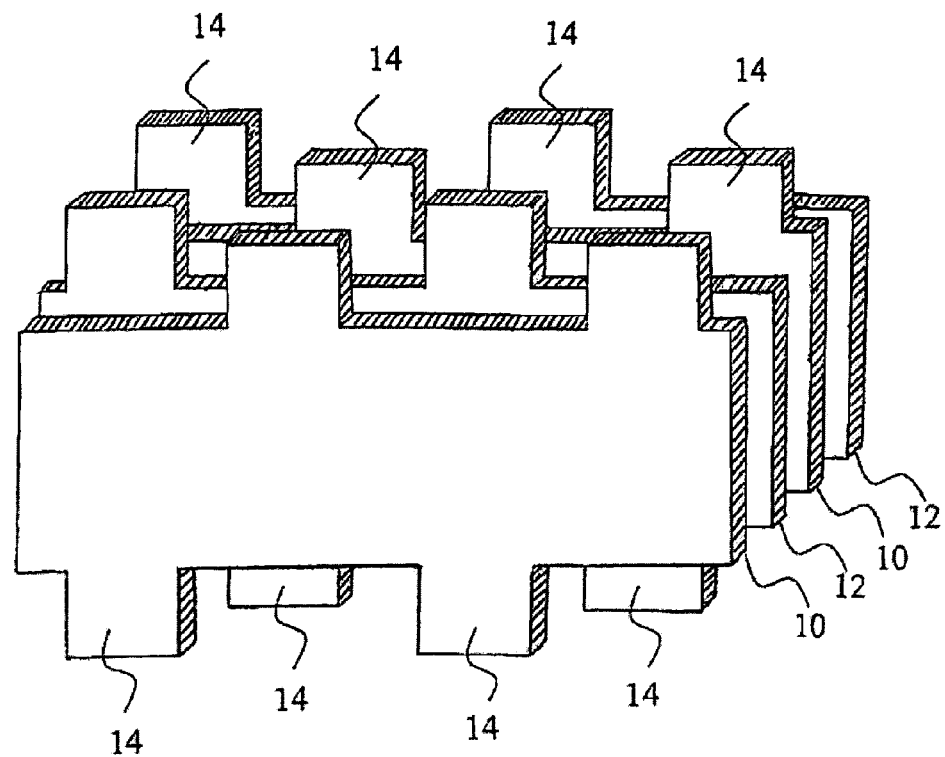
FIG. 1A illustrates a generally top exploded view of a known exemplary electrode layer configuration for a multilayer interdigitated capacitor.

Repeat use of reference characters throughout the present specification and appended drawings is intended to represent same or analogous features or elements of the invention.

DETAILED DESCRIPTION OF THE EMBODIMENTS

As referenced in the Brief Summary of the Invention section, supra, the present subject matter is directed towards improved termination features for monolithic electronic components.

The subject termination scheme utilizes exposed electrode portions of structures such as monolithic capacitor arrays, multilayer capacitors including those with interdigitated electrode configurations, integrated passive components, and other electronic chip structures. Additional anchor tabs may be embedded within such monolithic components to provide stacked pluralities of exposed internal conductive portions to which plated terminations may be formed and securely positioned along the periphery of a device.

By providing additional anchor tabs on selected top and/or bottom surfaces of a chip device, wrap-around plated terminations may be formed that extend along the side of a chip to one or more of the top and bottom layers. Such wrap-around terminations may be desirable in certain applications to facilitate soldering of the chip to a printed circuit board or other suitable substrate. Exposed tabs that extend along an entire side without wrapping around to the top and/or bottom layers may be formed by providing anchor tabs into respective corner radius portions of the top and bottom cover layers of the device, thus facilitating a landless termination that still enables good solder wetting to a printed circuit board or other mounting surface.

Figure 1B:
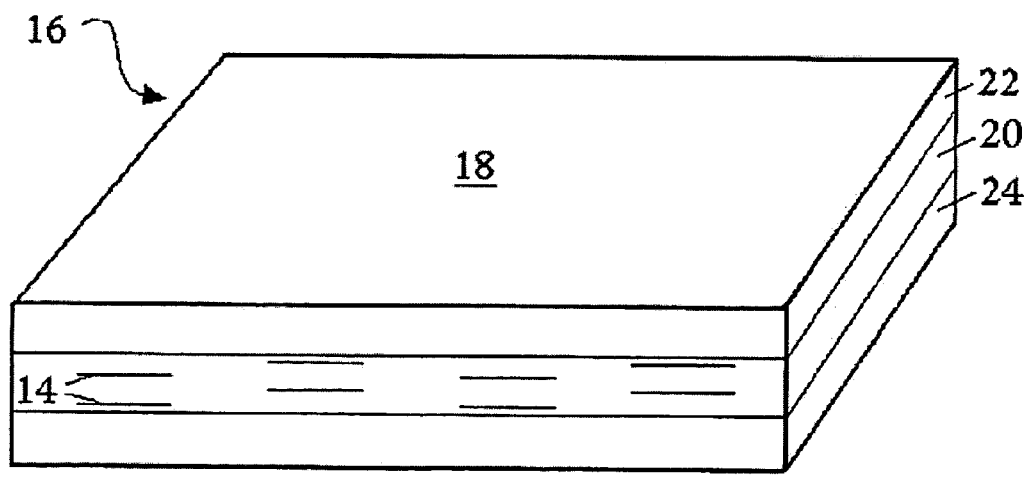
FIG. 1B illustrates a generally side perspective view of an exemplary multilayer interdigitated capacitor with an internal electrode layer configuration such as the known exemplary embodiment illustrated in FIG. 1A.

The subject plating technology and anchor tab features may be utilized in accordance with a plurality of different monolithic components. FIGS. 1A and 1B represent aspects of known interdigitated electrode layer configurations wherein electrode tabs generally extend to and are exposed on two selected sides of a multilayer component. Aspects of plated terminations in accordance with the present subject matter are thereafter presented with respect to FIGS. 2A and 2B, which also concern multilayer component embodiments with exposed conductive portions of two selected sides of a device.

Figure 3A:
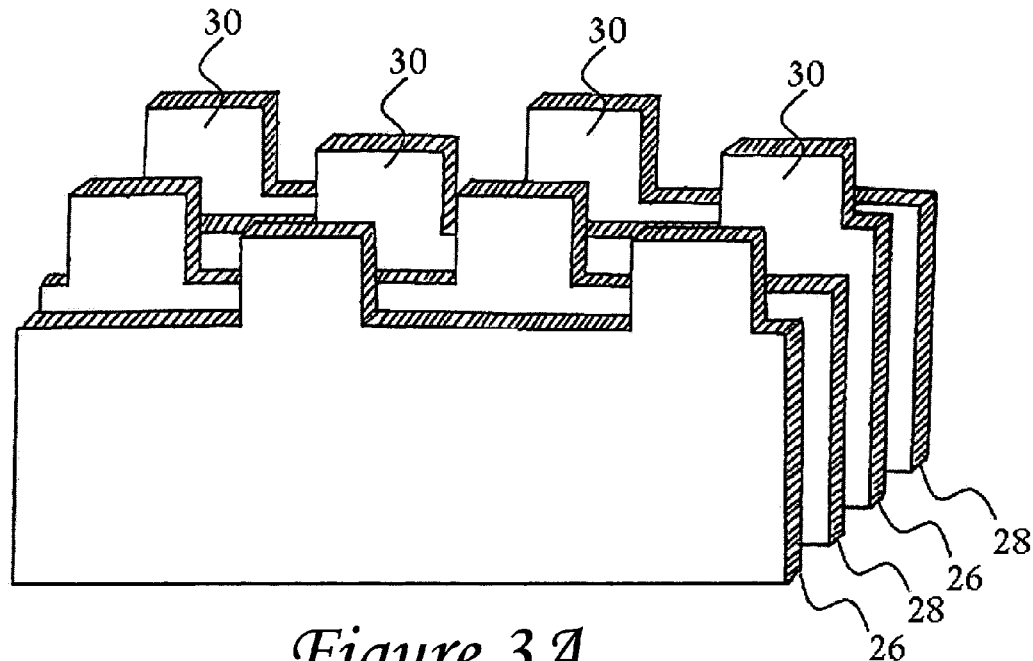
FIG. 3A illustrates a generally top exploded view of a known exemplary internal electrode layer configuration for a multilayer capacitor.
Figure 3B:
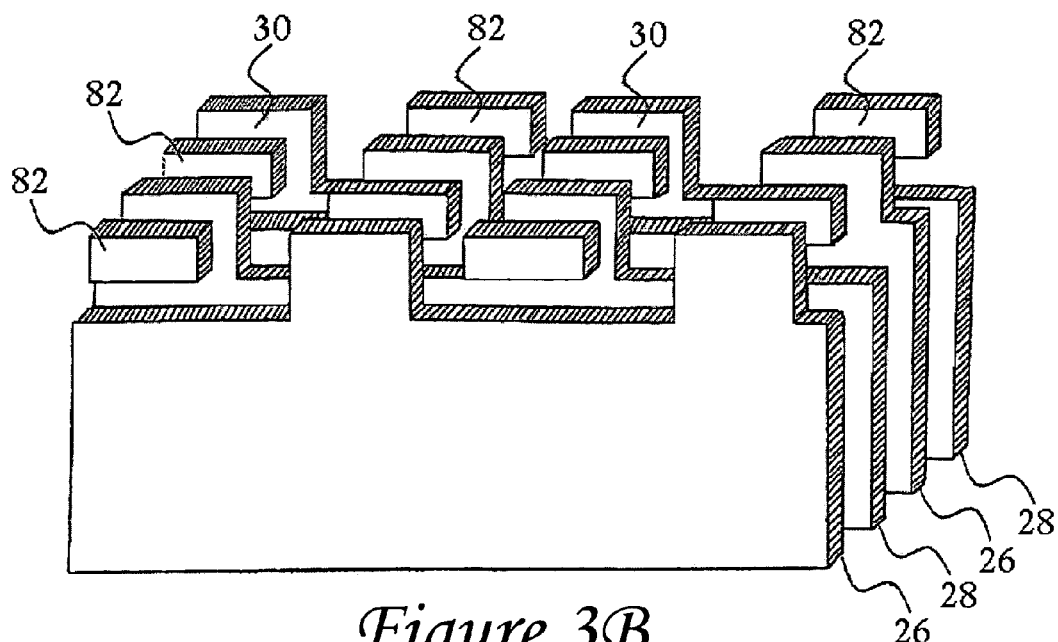
FIG. 3B illustrates a generally top exploded view of an exemplary internal electrode layer and anchor tab configuration for a multilayer capacitor in accordance with the present subject matter.
Figure 4A:
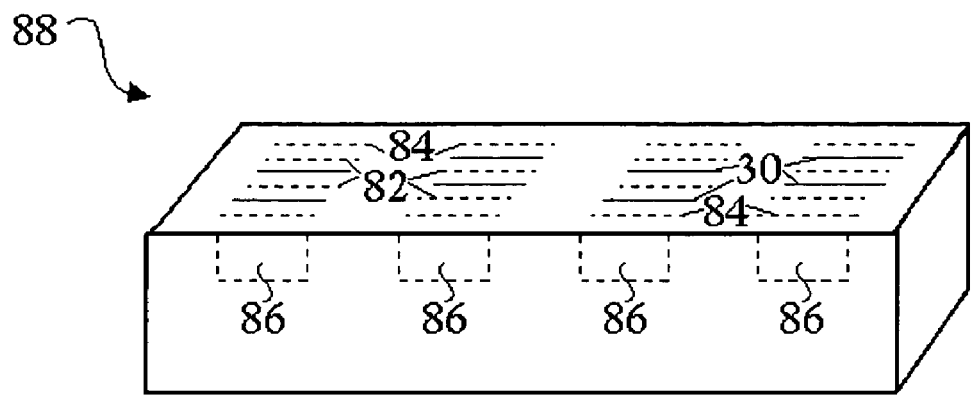
FIG. 4A illustrates a generally side perspective view of an exemplary multilayer capacitor in accordance with the present subject matter with internal electrode and anchor tab portions such as illustrated in FIG. 3B.
Figure 4B:
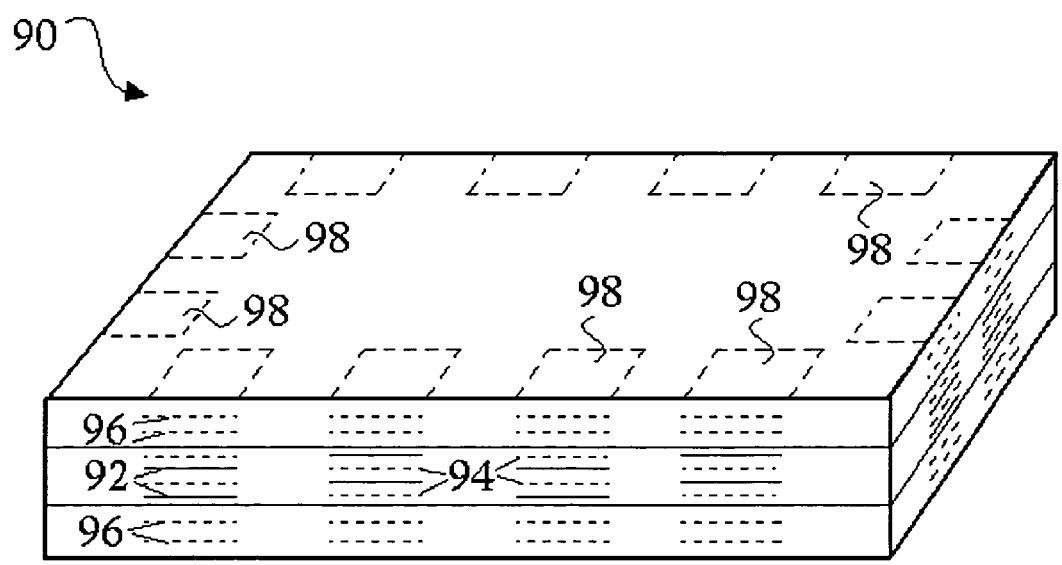
FIG. 4B illustrates a generally side perspective view of an exemplary multilayer interdigitated capacitor in accordance with the present subject matter, featuring internal electrode and anchor tab portions exposed on four selected sides of the exemplary capacitor configuration.

FIG. 3A illustrates aspects of a known electrode layer configuration with electrode tabs for exposure on one selected side of a multilayer electronic device. FIGS. 3B and 4A, respectively, relate to improvements of the exemplary embodiment presented in FIG. 3A, providing for an exemplary multilayer capacitor with internal electrode tabs exposed on one selected side of the capacitor and featuring anchor tabs in accordance with the present technology. FIG. 4B relates to an exemplary multilayer interdigitated component with internal electrode tabs and anchor tabs exposed on four selected sides of the component in accordance with the present subject matter.

Figure 5A:
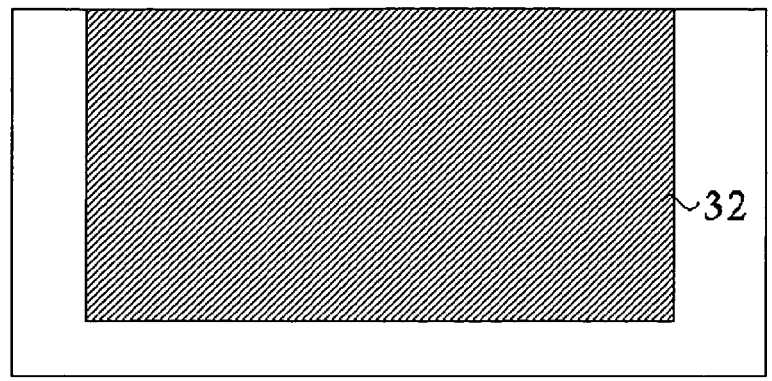
FIGS. 5A and 5B respectively illustrate generally top views of a known electrode layer configuration for use in exemplary multilayer capacitor embodiments.
Figure 5B:
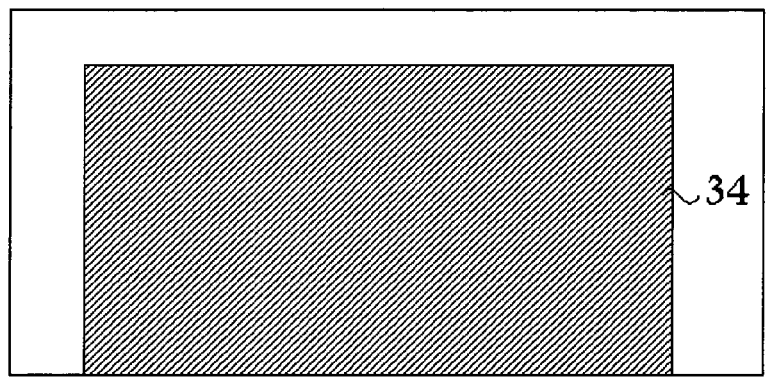
Figure 5C:
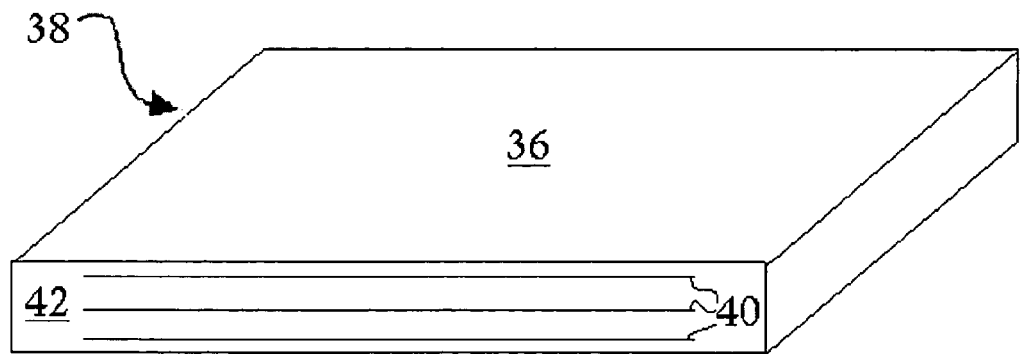
FIG. 5C illustrates a generally side perspective view of an exemplary multilayer capacitor embodiment with electrode layer configurations such as the known exemplary representations of FIGS. 5A and 5B.
Figures 10A, 10B:
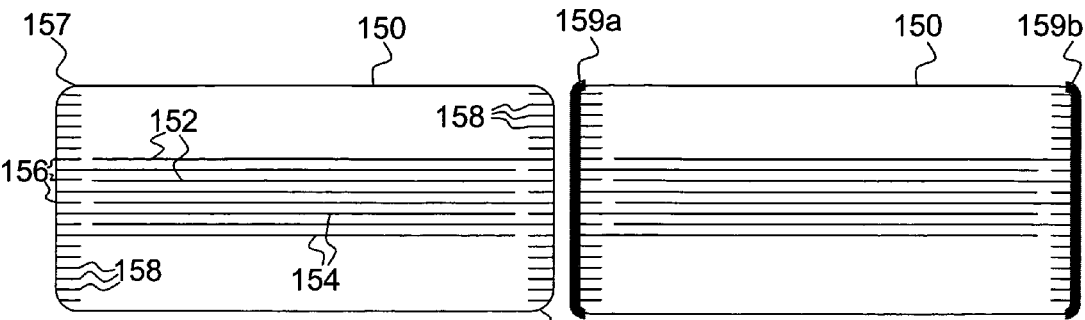
FIG. 10A illustrates a generally side cross-sectional view of an exemplary multilayer electronic component having electrodes and anchor tabs positioned and exposed for forming an "I-shaped" termination in accordance with the presently disclosed technology.
FIG. 10B illustrates a generally side cross-sectional view of an exemplary multilayer electronic component with "I-shaped" terminations, such as formed via subjection of the embodiment depicted in FIG. 10A to selected plating processes as presently disclosed in accordance with the present subject matter.
Figures 11A, 11B:
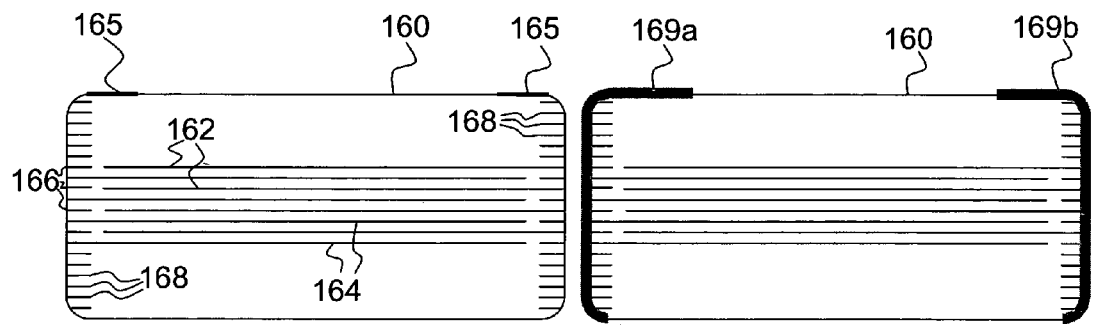
FIG. 11A illustrates a generally side cross-sectional view of an exemplary multilayer electronic component having electrodes and anchor tabs positioned and exposed for forming a "J-shaped" termination in accordance with the presently disclosed technology.
FIG. 11B illustrates a generally side cross-sectional view of an exemplary multilayer electronic component with "J-shaped" terminations, such as formed via subjection of the embodiment depicted in FIG. 11A to selected plating processes as presently disclosed in accordance with the present subject matter.
Figures 12A, 12B:
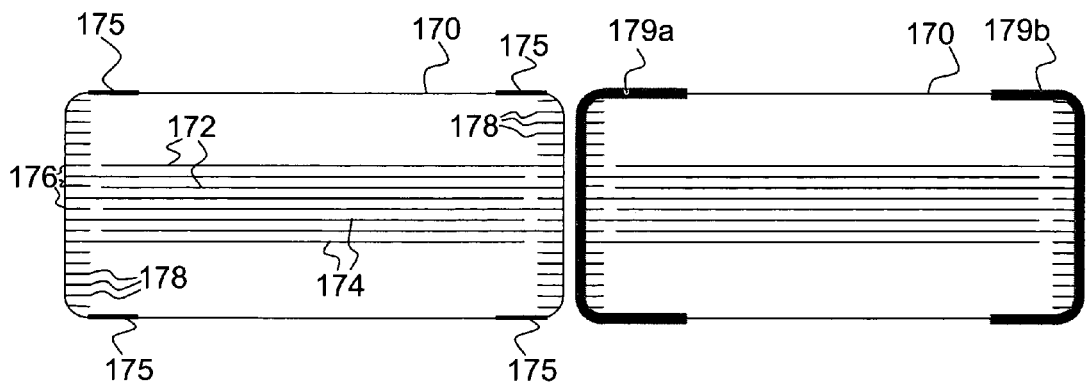
FIG. 12A illustrates a generally side cross-sectional view of an exemplary multilayer electronic component having electrodes and anchor tabs positioned and exposed for forming an "U-shaped" termination in accordance with the presently disclosed technology.
FIG. 12B illustrates a generally side cross-sectional view of an exemplary multilayer electronic component with "U-shaped" terminations, such as formed via subjection of the embodiment depicted in FIG. 12A to selected plating processes as presently disclosed in accordance with the present subject matter.
Figure 23A:
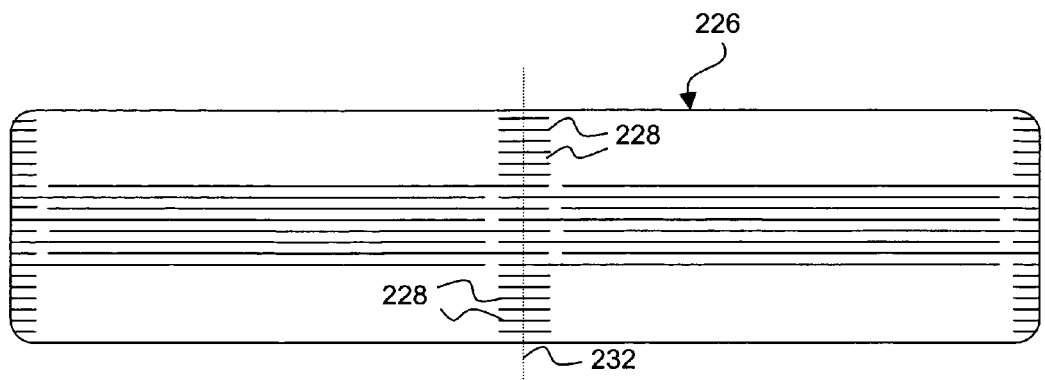
FIG. 23A illustrates an exemplary portion of a multilayer capacitor assembly that may be subjected to generally "V-shaped" dicing such as represented in FIG. 23B to produce multiple capacitors that after slight additional corner rounding may appear as depicted in FIG. 23C.
Figure 23B:
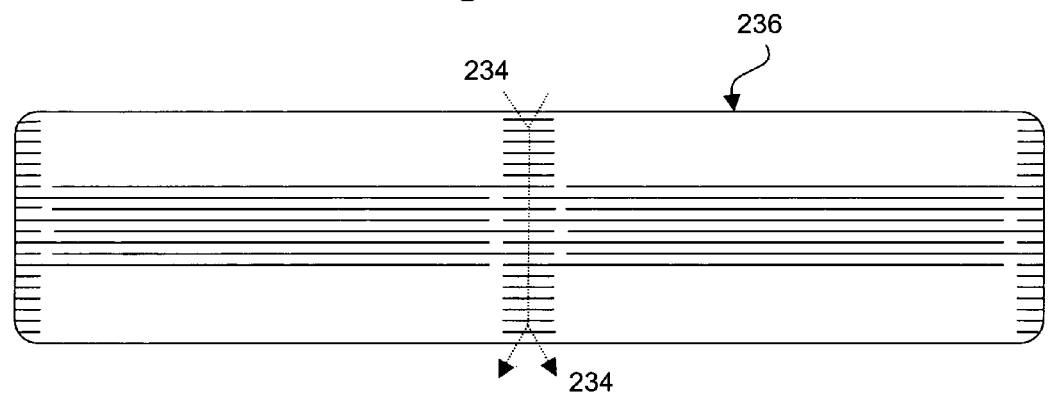
Figure 23C:
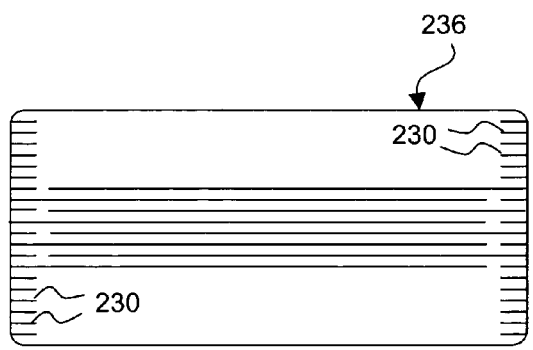
Figure 24:
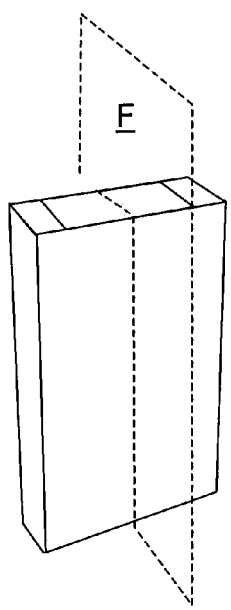
FIG. 24 depicts an exemplary terminated multilayer capacitor in accordance with the presently disclosed technology.
Figure 25:
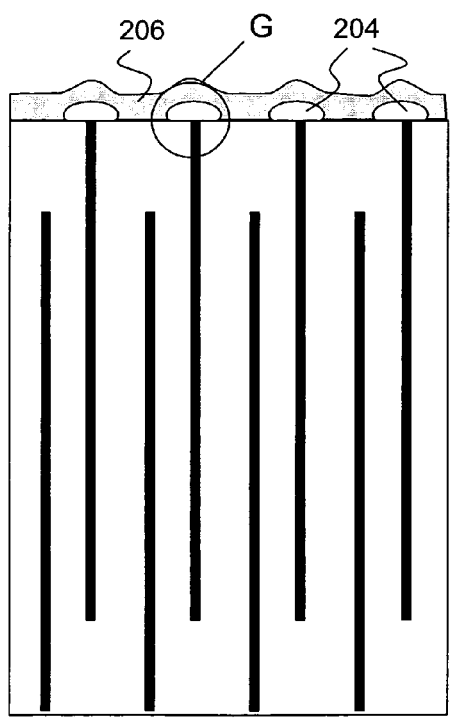
FIG. 25 illustrates an exemplary cross-section of the multilayer capacitor of FIG. 24 taken along plane F, depicting various visual features of the exemplary plated terminations in accordance with the present subject matter.
Figure 26:
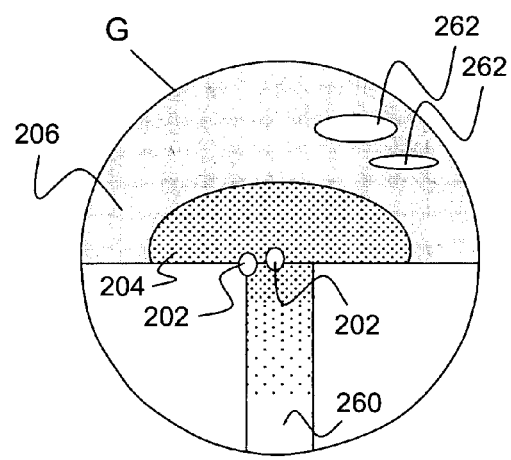
FIG. 26 illustrates an exemplary detailed view of area G of the capacitor cross-section depicted in FIG. 25, illustrating additional various visual features of exemplary plated terminations in accordance with the present subject matter.
Figure 27:
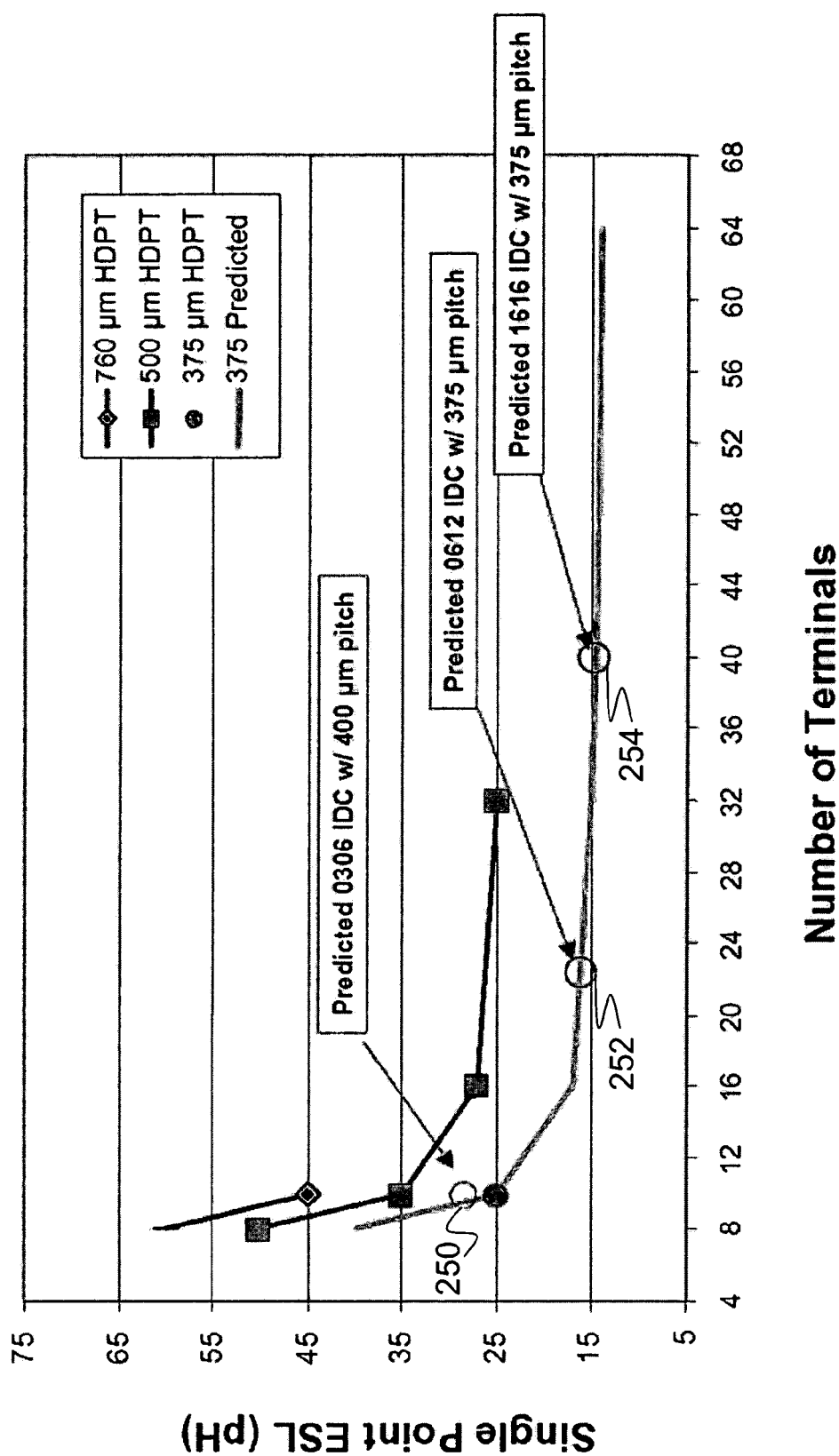
FIG. 27 provides a graphical representation of single point ESL measurements versus the number of terminals in High Density Peripheral Termination (HDPT) capacitors designed in accordance with the present subject matter.

Still further exemplary embodiments of the present subject matter relate to the multilayer capacitor configurations illustrated in FIGS. 6A through 6G, respectively, which are improvements to the exemplary multilayer capacitor configurations of FIGS. 5A through 5C, respectively. Additional examples of multilayer capacitor configurations are illustrated in FIGS. 13A through 13C, 14A through 14C, 15A through 15C, 16A through 16D and 17A through 17C, respectively. Still further embodiments of the disclosed technology are presented with reference to the exemplary capacitor arrays of FIGS. 7A and 7B. FIGS. 8A and 8B then represent aspects of the subject plated termination features, while FIGS. 9A and 9B concern an exemplary integrated passive component with selective terminations in accordance with the present subject matter. As more particular examples of possible uses of the presently disclosed technology, FIGS. 10A and 10B depict aspects of "I-shaped" terminations, while FIGS. 11A and 11B depict aspects of "J-shaped" terminations and FIGS. 12A and 12B depict aspects of "U-shaped" terminations. FIGS. 18A and 19A through 19D illustrate exemplary variations of the incorporation of anchor tabs, active capacitor electrodes and common electrodes in multilayer capacitors of the present technology. FIGS. 20, 21A through 21C and 22 more specifically illustrate exemplary aspects associated with providing anchor tabs in cover layers of a multilayer electronic component. FIGS. 23A through 23C, respectively, depict an exemplary V-cut dicing option that facilitates generally angled off and eventually rounded edges and corners for embodiments of the present subject matter. FIGS. 24, 25 and 26 illustrate specific exemplary features associated with the subject plated terminations, and FIG. 27 provides a graphical representation of ESL values associated with exemplary embodiments of the disclosed technology having a relatively high number and density of resultant peripheral terminations.

It should be noted that each of the exemplary embodiments as presented herein should not insinuate limitations of the disclosed technology. Features illustrated or described as part of one embodiment can be used in combination with another embodiment to yield further embodiments. Additionally, certain features may be interchanged with similar devices or features not mentioned yet which perform the same, similar or equivalent function.

Reference will now be made in detail to the presently preferred embodiments of the disclosed technology. Referring to the drawings, FIG. 1A illustrates a known exemplary configuration of electrode layers 10 and 12 with electrode tabs 14 for use in a multilayer interdigitated capacitor or capacitor array. Electrode layers are arranged in parallel with tabs 14 extending from the layers such that electrode tabs extending from alternating electrode layers 10 and 12 are aligned in respective columns. The exemplary illustration depicts four such electrode layers with corresponding tabs 14, but typical arrangements as utilized with the present technology may in some instances contain many more electrode layers and respective tabs. This feature provides the option of creating capacitive elements with a large range of capacitance values (by choosing the number of electrodes).

The exemplary electrode layer configuration of FIG. 1A is not representative of a finished capacitor embodiment. Instead, FIG. 1A provides a reference for an intermediate aspect of exemplary capacitor and capacitor array configurations. The electrode layer configuration of FIG. 1A can be utilized in accordance with an exemplary multilayer interdigitated capacitor such as displayed in FIG. 1B.

An interdigitated capacitor typically consists of a plurality of electrode layers, such as those shown in FIG. 1A disposed in a body of dielectric material 18, such as seen in the exemplary interdigitated capacitor configuration 16 of FIG. 1B. Electrode layers 10 and 12 are disposed in the dielectric material 18 such that electrode tabs 14 extend to and are exposed at two sides of IDC embodiment 16. Exemplary materials for such electrode layers may include platinum, nickel, a palladium-silver alloy, or other suitable conductive substances. Dielectric material 18 may comprise barium titanate, zinc oxide, alumina with low-fire glass, or other suitable ceramic or glass-bonded materials. Alternatively, the dielectric may be an organic compound such as an epoxy (with or without ceramic mixed in, with or without fiberglass), popular as circuit board materials, or other plastics common as dielectrics. In these cases the conductor is usually a copper foil which is chemically etched to provide the patterns.

Exemplary IDC embodiment 16 may alternatively be viewed as a multilayer configuration of alternating electrode layers and dielectric layers in portion 20 of the device. IDC 16 is typically further characterized by a topmost dielectric layer 22 and bottommost dielectric layer 24 that may be built up to be generally thicker than other dielectric layer portions of IDC configuration 16. Such dielectric layers 22 and 24 act as cover layers to protect the device and provide sufficient bulk to withstand the stress of glass/metal frit that may be fired to a capacitor body. Known capacitor embodiments have utilized the multilayer arrangement of FIG. 1B, and the present subject matter utilizes aspects of such configuration 16 in accordance with additional features disclosed herein.

A multilayer IDC component 16 such as that of FIG. 1B that incorporates the known exemplary electrode layer configuration of FIG. 1A is characterized by electrode portions 14 that are exposed on two selected sides of IDC component 16. Other exemplary internal electrode configurations may be employed in a multilayer component such that internal electrode portions are exposed at different locations and/or on different numbers of sides of the device.

For example, consider the exemplary internal electrode layer configuration illustrated in the exploded view of FIG. 3A. Alternating electrode layers 26 and 28 are provided with electrode tab portions 30 extending toward a single selected direction. Electrode tabs 30 for each set of alternating electrode layers are preferably arranged in a stacked configuration such that, for instance, tabs 30 from electrode layers 26 are aligned in two respective columns. A similar alignment situation preferably holds for tabs 30 of electrode layers 28. A multilayer capacitor or other passive component that utilizes the exemplary internal electrode configuration of FIG. 3A will typically be configured such that electrode tab portions 30 are exposed on a single selected side of the component.

Yet another exemplary internal electrode layer configuration provides for electrode tabs that are exposed on four sides of a multilayer interdigitated component. Such internal electrode layers may be similar to the configuration depicted in FIG. 1A wherein each alternating electrode layer 10 and 12 has additional tab portions on the sides of the layers adjacent to the sides from which tab portions 14 extend.

A still further exemplary electrode layer configuration and corresponding multilayer capacitor embodiment is depicted in FIGS. 5A through 5C, respectively. A first plurality of internal electrode layers 32 such as in FIG. 5A are interleaved with internal electrode layers 34, such as in FIG. 5B, in a body of dielectric material 36 to form a multilayer capacitor 38 such as in FIG. 5C. In such exemplary multilayer component 38, portions 40 of one set of electrode layers 32 or 34 is exposed on side 42 of component 38. The portions of the other set of electrode layers 32 or 34 are thus exposed on the side of the device opposite of side 42 (not seen in the drawing).

Referring again to FIG. 1B, a typical conventional termination for IDC embodiment 16 and for other monolithic electronic components comprises a printed and fired thick-film stripe of silver, copper, or other suitable metal in a glass matrix, on top of which is plated a layer of nickel to promote leach resistance, and is followed by a layer of tin or solder alloy which protects the nickel from oxidation, and promotes an easily soldered termination.

A thick-film stripe in accordance with such type of termination also typically requires printed application by a termination machine and printing wheel or other suitable component to transfer a metal-loaded paste. Such printing hardware may have resolution limits that make it hard to apply thick-film stripes, especially to smaller chips. A typical existing size for an IDC 16 or other electronic component is about one hundred and twenty mils (thousandths of an inch) by sixty mils along the two opposing sets of sides with a thickness from top to bottom layers of about thirty mils. When more than four terminations need to be applied to a part this size or terminations are desired for a part with smaller dimensions, the resolution levels of specialized termination machinery often becomes a limitation in applying effective termination stripes.

The present subject matter offers a termination scheme that eliminates or greatly simplifies the provision of such typical thick-film termination stripes. By eliminating the less-controlled thick film stripe, the need for typical termination printing hardware is obviated. Termination features in accordance with the disclosed technology focus more on the plated layer of nickel, tin, copper, etc. that is typically formed over a thick-film termination stripe.

With plated terminations in accordance with the presently disclosed technology, it should be appreciated that it is possible to form terminations that are the same width along a component's periphery as that of the exposed internal electrodes. In prior art termination schemes, where thick-film termination stripes are applied, the terminations are typically wider than the exposed electrode portions to account for potential misregistration of exposed tabs. Exposed electrode portions in such prior art embodiments must typically be narrow enough to not only ensure complete coverage thereof by the terminations, but also to ensure that adjacent terminations do not short together. In accordance with aspects of the presently disclosed plated terminations, the pitch between adjacent columns of exposed internal electrode pads need not be as great. Since the potential problems associated with thick-film terminations are eliminated in many embodiments, capacitors may be made with electrode tabs having greater width, or reduced pitch between adjacent columns of electrode tabs, or with a higher number of electrode tabs. Each of the aforementioned capacitor modifications yields electronic components with advantageously lower equivalent series inductance (ESL).

ESL can be particularly lowered when more electrode tabs are utilized in a multilayer capacitor embodiment and when columns of such electrode tabs are closer together. Interdigitated capacitors having a relatively large number of electrode tabs per electrode have a resulting large number of electrical terminals and are thus often referred to as High Density Peripheral Termination (HDPT) capacitors. The construction and termination of such parts is facilitated in accordance with the presently disclosed technology, thus achieving components with improved ESL characteristics. A graph illustrating this phenomenon is provided in FIG. 27, which shows several curves modeling the single point ESL in picoHenries (pH) versus number of terminals in an interdigitated capacitor. The curve with the diamond-shaped data point corresponds to the measured ESL for HDPT capacitors with 8–10 terminals having a pitch of about 760 µm. The curve with the square-shaped data points corresponds to the measured ESL for HDPT capacitors with 8–32 terminals having a pitch between terminals of about 500 μm. The solid circular data point and portion of the corresponding line between 8–10 terminals represents the measured ESL versus number of terminals with a terminal pitch of 375 μm. The portion of the line extending beyond the sold circular data point (>10 terminals) represents the predicted ESL versus number of terminals with terminals having a pitch of about 375 μm. Circular data point 250 represents the predicted ESL for an 0306 size interdigitated capacitor (IDC) having a 400 μm pitch between its 10 terminals. Circular data point 252 represents the predicted ESL for an 0612 size IDC having a 375 μm pitch among its 22 terminals. Circular data point 254 corresponds to the predicted ESL for a 1616 size IDC having a 375 μm pitch between components. As should be understood by one of ordinary skill in the art, a component size of "XXYY" corresponds to one having a width dimension of 0.XX inches and a length dimension of 0.YY inches.

Figure 7A:
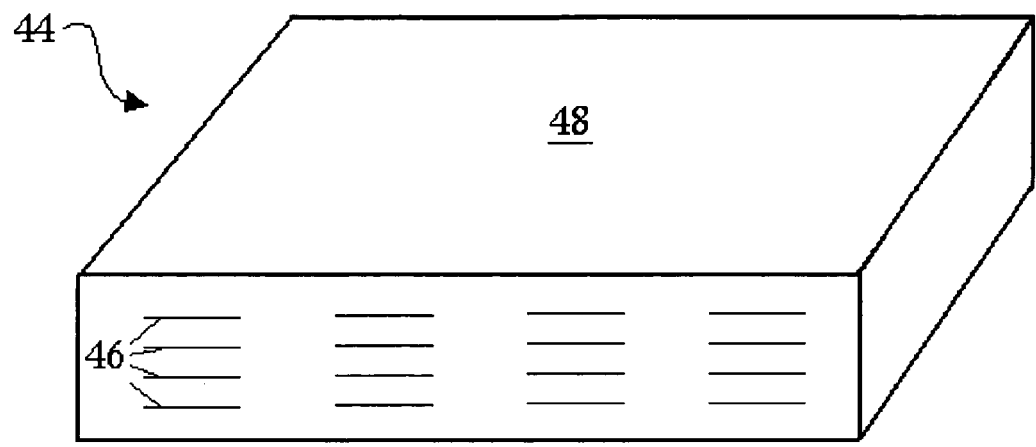
FIG. 7A illustrates a generally side perspective view of an exemplary capacitor array with exposed electrode tabs.
Figure 7B:
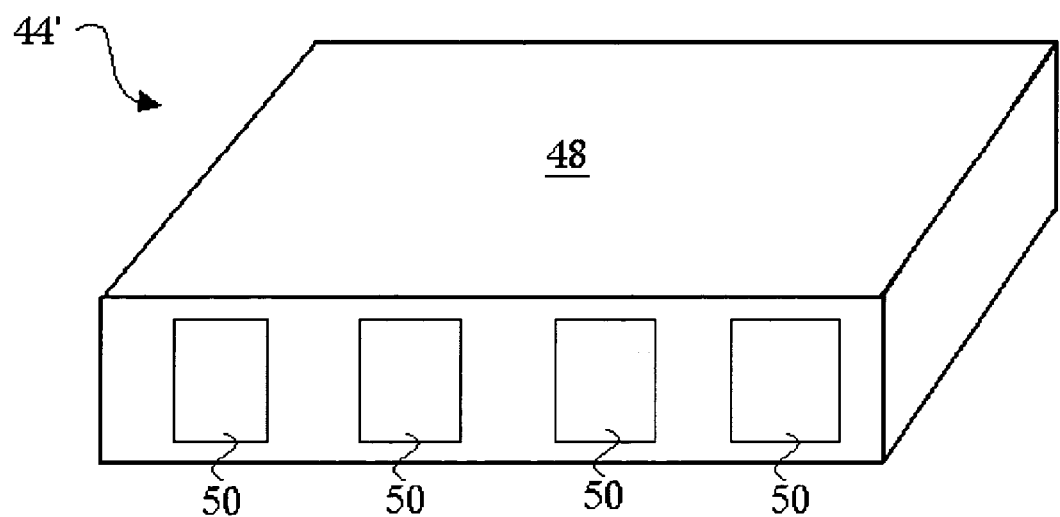
FIG. 7B illustrates a generally side perspective view of an exemplary capacitor array with plated terminations in accordance with the present subject matter.
Figure 8A:
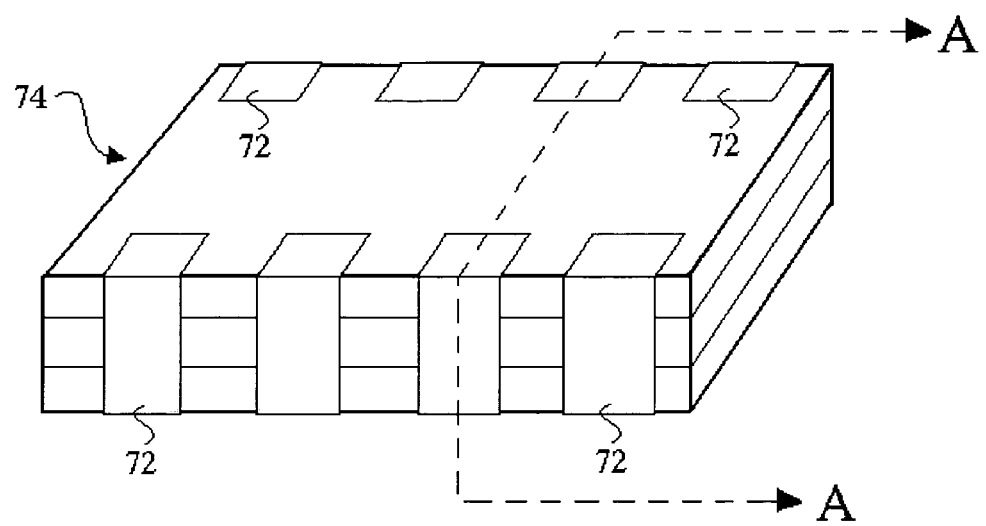
FIG. 8A illustrates a generally side perspective view of an exemplary multilayer interdigitated capacitor with plated terminations in accordance with the present subject matter.
Figure 8B:
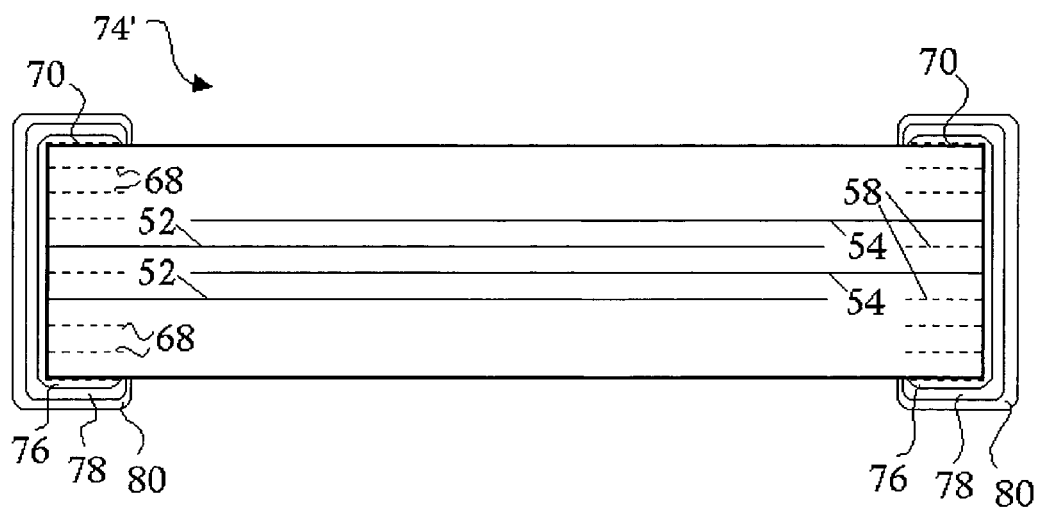
FIG. 8B illustrates a side cross-sectional view of an exemplary multilayer interdigitated capacitor with exemplary plated terminations in accordance with the disclosed technology taken along planar section line A—A of FIG. 8A.

Now consider the exemplary capacitor array configuration 44 presented in FIG. 7A. Capacitor array 44 is characterized by a plurality of internal electrodes and corresponding electrode tabs 46 embedded in a body of dielectric material 48. As opposed to the electrode layers of exemplary IDC configuration 16, the electrode tabs 46 of capacitor array 44 typically correspond to separate internal electrodes. By subjecting capacitor array 44 or other electronic component with similarly exposed electrode tabs to an electroless plating solution, for example nickel or copper ionic solution, the formation of plated terminations 50, such as is shown in FIG. 7B, is preferably effected. Exposure to such solution enables the exposed electrode tabs 46 to become deposited with nickel, copper, tin or other metallic plating. The resulting deposition of plated material is preferably enough to effect an electrical connection between adjacent electrode tabs 46 in a stacked column. The distance between adjacent electrode tabs in a column of tabs should preferably be no greater than about ten microns to ensure proper plating, and may be less than about eight microns in some embodiments. The distance between adjacent columnar stacks of electrode tabs 46 should thus be greater by at least a factor of 2 than this minimum distance to ensure that distinct terminations 50 do not run together. In some embodiments of the present technology, the distance between adjacent columnar stacks of exposed metallization is about four times the distance between adjacent exposed electrode tabs 46 in a particular stack. By controlling the distance between exposed internal conductor portions, termination connectivity can be manipulated to form bridged or non-bridged terminations depending on the desired termination configuration.

Plated terminations 50 are thus guided by the positioning of the exposed electrode tabs 46. This phenomena is hereafter referred to as "self-determining" since the formation of plated terminations 50 is determined by the configuration of exposed metallization at selected peripheral locations on multilayer component, or capacitor array, 44. The exposed internal electrode tabs 46 also help anchor terminations 50 to the periphery of capacitor array 44', which corresponds to a multilayer capacitor embodiment such as 44 of FIG. 7A with the addition of plated terminations 50. Further assurance of complete plating coverage and bonding of the metals may be achieved by including resistance-reducing additives in the plating solution.

A still further mechanism for enhancing the adhesion of metallic deposit that forms the subject plated terminations is to thereafter heat the component in accordance with such technologies as baking, laser subjection, UV exposure, microwave exposure, arcwelding, etc. This heating step, also referred to in the art as annealing, often results in the diffusion of some of the plated termination material into the adjacent exposed conductive portions (e.g., internal electrodes, internal and/or external anchor tabs). The resultant diffusion evident from such an annealing process is represented in the example of FIG. 26, which displays a detailed view of the area G from FIG. 25, which respectively illustrates an exemplary cross-section of the multilayer device of FIG. 24 taken along plane F. When conductive portion 204 (for example, copper plating) is formed at an exposed conductive portion 260 (for example, a Nickel electrode) some copper from portion 204 will diffuse into the portion 260. This phenomenon is represented by the downward gradient shading in portion 260. The annealing step may also result in some voiding in selected portions of the plated terminations (for example in plated layer 206). Such voiding (represented by exemplary areas 262) may be the result of "Kirkendall" voiding, where diffusion of the adjacent conductive portions during annealing causes formed alloy(s) to take up less volume than the original constituents.

The plated terminations 50 of FIG. 7B may be sufficiently formed for some component applications, but sometimes the exposed metallization from internal electrode tabs is insufficient to form the self-determining terminations of the present technology. In such case, it may be beneficial, and in some cases necessary, to provide additional anchor tabs embedded within select portions of a monolithic component. Anchor tabs are short conductive tabs that typically offer no electrical functionality to a component, but mechanically nucleate and secure additional plated termination along the periphery of a monolithic device. Exposed anchor tabs in combination with exposed internal electrode portions can provide sufficient exposed metallization to create more effective self-determining terminations.

Figure 2A:
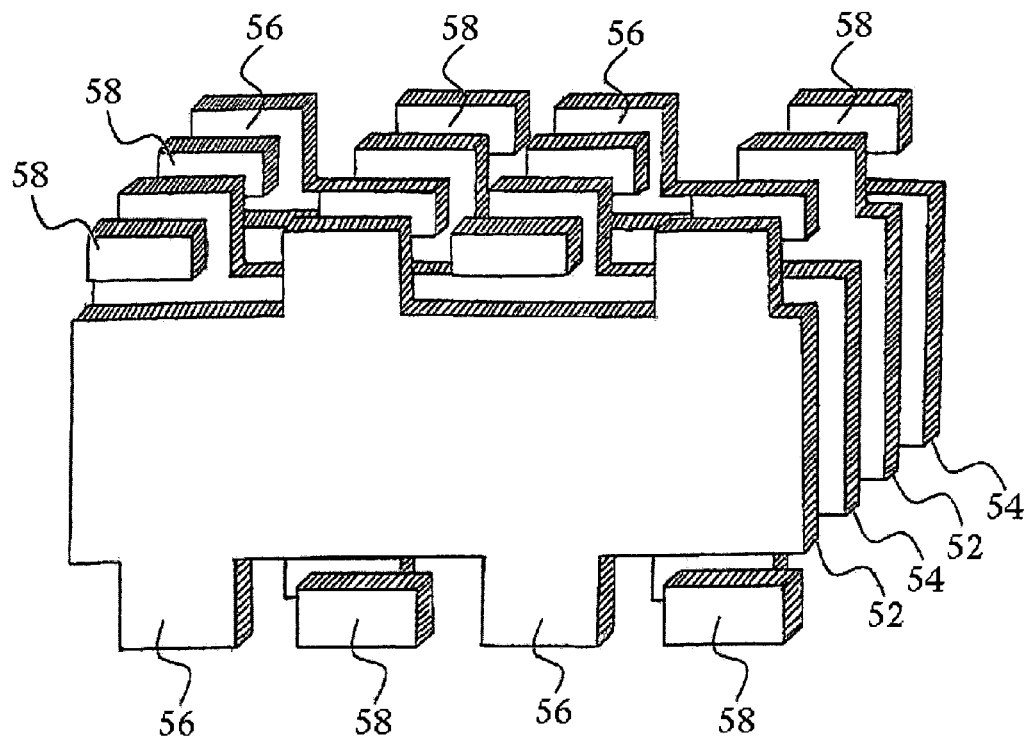
FIG. 2A illustrates a generally top exploded view of an exemplary internal electrode layer and anchor tab configuration for a multilayer interdigitated capacitor in accordance with the present subject matter.

For instance, consider the exploded configuration of exemplary internal metallization illustrated in FIG. 2A. Alternating electrode layers 52 and 54 are provided in a similar configuration to the electrode layers of FIG. 1A, with electrode tab portions 56 extending from selected locations of electrode layers 52 and 54. Additional anchor tabs 58 are also preferably provided in the same plane as active electrode layers 52 and 54 such that they are also exposed at selected locations along a multilayer component, yet offer no internal electrical connections. Additional anchor tabs may also be provided in the cover layers of a multilayer component and exposed along selected sides such that the formation of self-determining plated terminations that extend along even more of the component periphery is enabled.

Figure 2B:
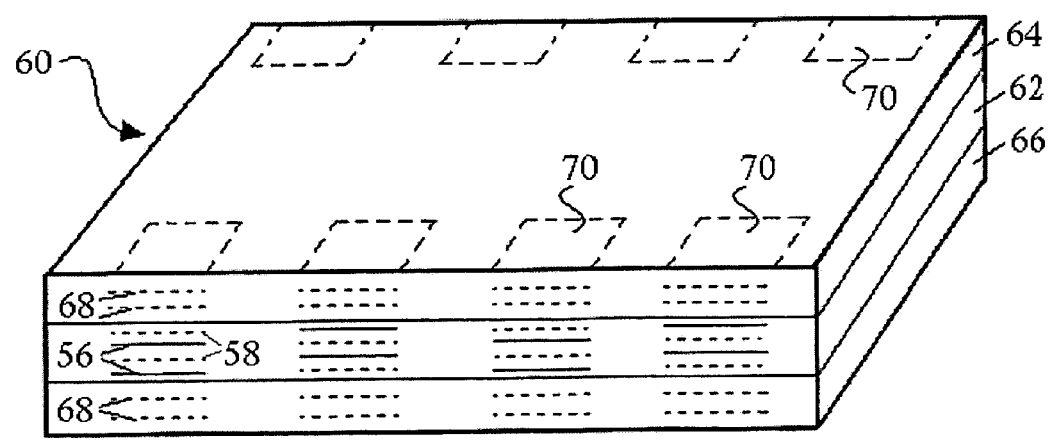
FIG. 2B illustrates a generally side perspective view of an exemplary multilayer interdigitated capacitor in accordance with the present subject matter with internal electrode and anchor tab portions such as illustrated in FIG. 2A.

With reference to FIG. 2B, multilayer component 60 corresponds to an exemplary multilayer capacitor embodiment in accordance with the present subject matter. Portion 62 of multilayer component 60 preferably comprises the exemplary interdigitated electrode layer and anchor tab configuration of FIG. 2A embedded within a portion of dielectric material. Solid lines 56 along the periphery of portion 62 are intended to represent exposed portions of the electrode tabs 56 of FIG. 2A, and dashed lines 58 along the periphery of portion 62 represent exposed anchor tabs 58. Additional anchor tabs (not illustrated in FIG. 2A) may be embedded within dielectric cover layers 64 and 66 (exposed portions of which are represented by dashed lines 68) to further provide an arrangement of exposed metallization for facilitating the formation of self-determining plated terminations in accordance with the present subject matter. Internal anchor tabs are preferably aligned in a generally similar column as a stack of internal electrode tabs such that all internal tabs are arranged in common stacks. It was previously mentioned that the distance between adjacent electrode tabs in a column of tabs should preferably be no greater than about ten microns to ensure proper plating. It should be appreciated that this distance should generally reflect the distance between exposed conductive portions including exposed electrode tabs and anchor tabs, when such structures are utilized. Although it may be recommended that some exemplary embodiments of the present technology have a distance between adjacent exposed conductive portions in a given column of no greater than about ten microns, such distance may be less than about eight microns in some embodiments.

For some component applications, it may be preferred that terminations not only extend along the entire width of a component, but also wrap around to the top and/or bottom layers. In this case, external anchor tabs, or lands, 70 may be positioned on top and bottom layers of multilayer IDC 60 such that plated terminations can form along the sides and on portions of the top and bottom layers, forming extended solder lands. For example, the provision of embedded internal anchor tabs 58 and 68 and external anchor tabs 70 along with existing exposed electrode tabs 56 in IDC 60, such as depicted in FIG. 2B, would facilitate the formation of wrap-around plated terminations 72, such as in FIG. 8A.

Figure 19A:
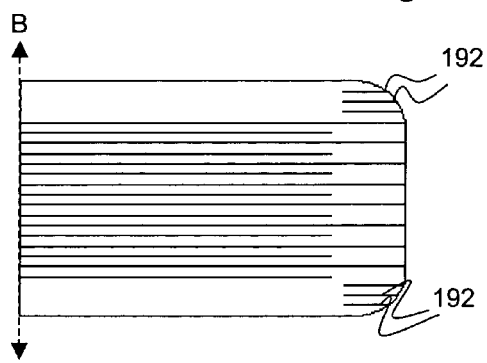
FIG. 19A illustrates an exemplary cross-section of the multilayer capacitor of FIG. 18 taken along lines B—B and C—C, specifically depicting the use of internal anchor tabs in the cover layers only of a multilayer capacitor.

Additional insight into the selective use of anchor tabs in accordance with the presently disclosed technology is depicted in FIGS. 18 and 19A–19D, respectively. FIGS. 19A, 19B, 19C and 19D each illustrate respective exemplary cross-sections of the multilayer capacitor illustrated in FIG. 18 when taken along the planes represented by lines B and C. FIG. 19A illustrates an exemplary multilayer device where anchor tabs 192 are embedded in the cover layers such that terminations can be formed that extend along the entire height of a device. It is advantageous in certain embodiments to extend the termination to the top and/or bottom surface of the device such that when the device is subjected to process(es) for creating generally rounded edges, land-less terminations can be applied that still facilitate effective solder wetting to a printed circuit board or other mounting substrate. In some exemplary embodiments, anchor tabs 192 may be embedded at distances within two mils (more specifically, within about 1.0–1.5 mils) from top and/or bottom device surfaces. In still further embodiments, multilayer devices may have relatively thin cover layers (e.g., less than about two mils), which serves to lower the equivalent series inductance (ESL) of a device.

Figure 19B:
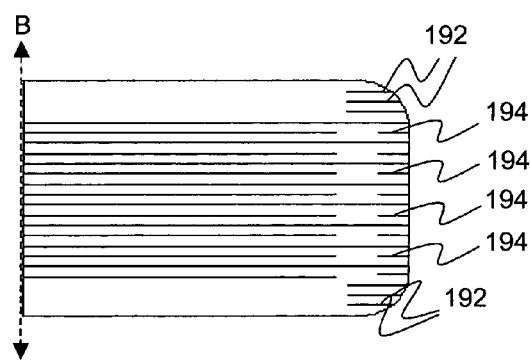
FIG. 19B illustrates an exemplary cross-section of the multilayer capacitor of FIG. 18 taken along lines B—B and C—C, specifically depicting the use of internal anchor tabs in both the cover layers and active layers of a multilayer capacitor.
Figure 19C:
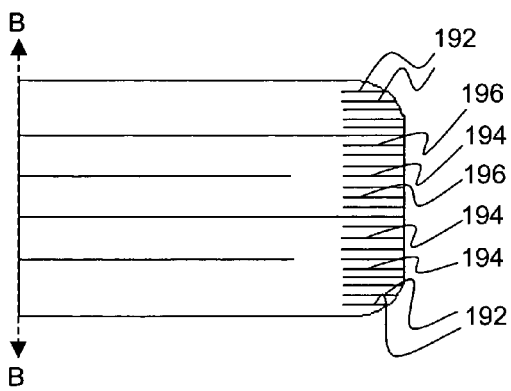
FIG. 19C illustrates an exemplary cross-section of the multilayer capacitor of FIG. 18 taken along lines B—B and C—C, specifically depicting the use of internal anchor tabs in the cover layers and active layers of a multilayer capacitor having reduced number of active layers and corresponding capacitance.

Referring now to FIG. 19B, it may be desirable in some embodiments of the present subject matter to provide internal anchor tabs in the active layers (depicted as anchor tabs 194) as well as the cover layers (depicted as anchor tabs 192). In such case, anchor tabs 194, designed as additional nucleation points for a termination of one polarity, may be printed in the same plane as the electrode layers of the opposite polarity. In still further embodiments, anchor tabs may also be used in between active layers when there is greater spacing between such layers, such as in generally lower capacitance or higher voltage rated devices. Such internal anchor tabs between active layers in FIG. 19C are depicted as anchor tabs 196. Since it is possible to provide anchor tabs anywhere desirable within an electronic device to provide nucleation points along a device periphery, overall device size or capacitance should not limit the use and application of plated terminations in accordance with the presently disclosed technology.

Figure 19D:
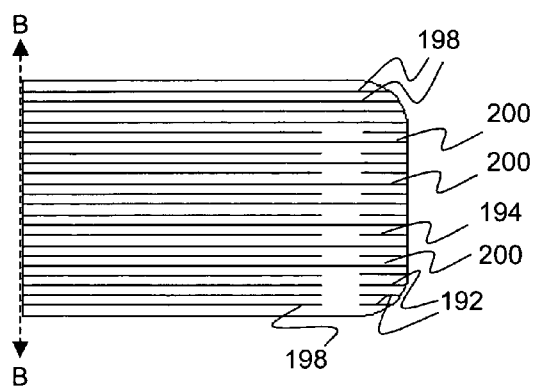
FIG. 19D illustrates an exemplary cross-section of the multilayer capacitor of FIG. 28 taken along lines B—B and C—C, specifically depicting the use of common electrode layers in the cover layers of a multilayer capacitor.
Figure 20:
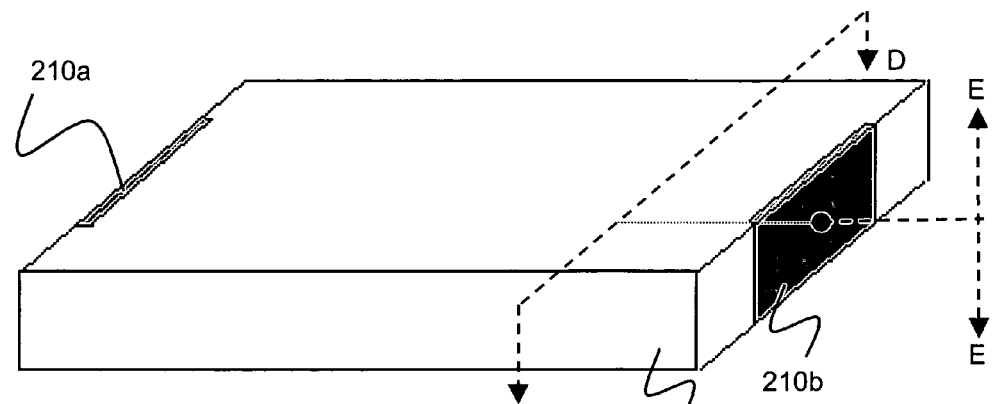
FIG. 20 depicts an exemplary terminated multilayer capacitor in accordance with the presently disclosed technology.

Another option for extending nucleation points into the cover layers of a multilayer capacitor is represented in FIG. 19D. Instead of utilizing only anchor tabs 192 in the cover layers, common electrode layers 198 may be provided in the cover layers with or without additional anchor tabs 192. In such embodiment, the active electrode layers 200 of the device comprise multiple pairs of opposing first and second electrode layers. One of the cover layers may then include common electrode layers formed in the same or similar fashion as the first electrode layer, while the other cover layer includes common electrode layers similar to the second electrode layers. Each layer could include anchor tabs as illustrated in FIG. 19D but anchor tabs may not be required in embodiments where the spacing between electrode layers is sufficiently small. An advantage to using common electrode layers in the cover layers as opposed to only anchor tabs may be realized by the common electrode layers providing additional mechanical support and uniformity in the cover layers.

There are several different techniques that can potentially be used to form plated terminations, such as terminations 72 on multilayer component embodiment 74 of FIG. 8A. As previously addressed, a first method corresponds to electroplating or electrochemical deposition, wherein an electronic component with exposed conductive portions is exposed to a plating solution such as electrolytic nickel or electrolytic tin characterized by an electrical bias. The component itself is then biased to a polarity opposite that of the plating solution, and conductive elements in the plating solution are attracted to the exposed metallization of the component. Such a plating technique with no polar biasing is referred to as electroless plating, and can be employed in conjunction with electroless plating solutions such as nickel or copper ionic solution.

In accordance with electroless plating techniques, also referred to in some applications as immersion plating, preliminary steps may sometimes be utilized before immersing an electronic component in a given electroless plating solution. After an electronic component is formed with exposed metallic electrode and/or anchor tab portions, a chemical polishing step may be effected to aid exposure of the metallic portions. For example, when electrode and/or anchor tab portions are made of Nickel, chemical polishing can help to chemically remove any buildup of Nickel Oxide (NiO) on the periphery of the yet unterminated component.

A still further example of a preliminary step that may be utilized in accordance with presently disclosed electroless plating techniques is a step to activate the exposed metallic portions of the device to facilitate depositing of the electrolessly plated materials. Activation can be achieved by immersion of the electronic component in Palladium salts, photo patterned Palladium organometallic precursors (via mask or laser), screen printed or ink-jet deposited Palladium compounds or electrophoretic Palladium deposition. It should be appreciated that Palladium-based activation is presently disclosed merely as an example of activation solutions that often work well with activation for exposed electrode and/or tab portions formed of Nickel or Nickel-based alloys. In other embodiments, alternative activation solutions may be utilized. In still further embodiments, a Palladium (Pd) dopant may be introduced into the Nickel ink that forms the capacitor electrodes and/or anchor tabs to eliminate the Pd activation step for electroless Cu deposition. It should be further appreciated that some of the above activation methods, such as organometallic precursors, also lend themselves to co-deposition of glass formers for increased adhesion to the generally ceramic body of an electronic component. When activation steps are taken as described above, traces of the activator material (represented by portions 202 in FIG. 26) often remain at the exposed conductive portions before and after termination plating.

In accordance with electrochemical deposition and electroless plating techniques, a component such as IDC 74 of FIG. 8A, is preferably submersed in an appropriate plating solution for a particular amount of time. With certain embodiments of the present subject matter, no longer than fifteen minutes is required for enough plating material to deposit at exposed conductive locations along a component such that buildup is enough to spread the plating material in a perpendicular direction to the exposed conductive locations and create a bridged connection among selected adjacent exposed conductive portions. In some embodiments of the present technology, completely bridged terminations may not be formed when plating an initial material, but only after subsequent plating steps. For example, referring to FIG. 25, a first plating step may result in the formation of unconnected "bump"-like portions 204 of plating material. A completely bridged termination is then achieved upon plating a second portion 206 of material over the initial unconnected portions 204. It should be further noted with respect to FIG. 25 that the initial build-up of electroless plating portions 204 underneath final plated layer 206 may result in a generally "wavy" appearance at the termination periphery. This visual aspect may be evident even when initial plated portions 204 are formed in a connected bridge, and with or without the provision of subsequent plated layers.

Another technique that may be utilized in accordance with the formation of the subject plated terminations involves magnetic attraction of plating material. For instance, nickel particles suspended in a bath solution can be attracted to similarly conductive exposed electrode tabs and anchor tabs of a multilayer component by taking advantage of the magnetic properties of nickel. Other materials with similar magnetic properties may be employed in the formation of plated terminations, or other materials can be coated over the magnetic cores.

A still further technique regarding the application of plated termination material to exposed electrode tabs and/or anchor tabs of a multilayer component involves the principles of electrophoretics or electrostatics. In accordance with such exemplary technology, a bath solution contains electrostatically charged particles. An IDC or other multilayer component with exposed conductive portions may then be biased with an opposite charge and subjected to the bath solution such that the charged particles are deposited at select locations on the component. This technique is particularly useful in the application of glass and other semiconductive or nonconductive materials. Once such materials are deposited, it is possible to thereafter convert the deposited materials to conductive materials by intermediate application of sufficient heat to the component.

A related advantage of most of the methods disclosed herein for forming plated terminations is that multiple electronic components can be terminated in a bulk process, such as a barrel plating, fluidized bed plating and/or flow-through plating termination processes, all of which are generally known to one of ordinary skill in the art. Such aspect facilitates more convenient and expedient component termination since device manufacture no longer requires the selective application of terminations via precisely configured termination machines.

It should also be appreciated that as these electronic parts get ever smaller, the practical matter of being able to physically hold them while applying the thick film termination to each end becomes less practicable.

Further, this thin film approach provides less dimensional variability, permitting easier automatic handling.

One particular methodology for forming plated terminations in accordance with the disclosed technology relates to a combination of the above-referenced plating application techniques. A multilayer component may first be submersed in an electroless plating solution, such as copper ionic solution, to deposit an initial layer of copper over exposed tab portions, and provide a larger contact area. The plating technique may then be switched to an electrochemical plating system which allows for a faster buildup of copper on the selected portions of such component.

In still further exemplary methods, the initial component submersion in an electroless plating solution may effect the formation of initial unconnected portions 204 such as illustrated in FIG. 25. Electrochemical plating or electrolytic plating may then be employed to form a subsequent bridged portion 206 of termination material. When the initial portions 204 are formed of Copper, the bridged portion 206 may correspond to additional buildup of Copper in some exemplary embodiments or to electroplated deposition of a different material, such as nickel (Ni), gold (Au), silver (Ag), nickel-phosphorus (NiP), or other suitable alloys in other exemplary embodiments.

In accordance with the different available techniques for plating material to exposed conductive elements of a multilayer component in accordance with the present technology, different types of materials may be used to create the plated terminations and form electrical connections to internal features of an electrical component. For instance, metallic conductors such as nickel, copper, tin, etc. may be utilized as well as suitable resistive conductors or semiconductive materials, and/or combinations of selected of these different types of materials.

A particular example of plated terminations in accordance with the present subject matter wherein plated terminations comprise a plurality of different materials is discussed with reference to FIG. 8B. FIG. 8B provides a cross-sectional view of component 74 of FIG. 8A taken along planar section line A—A in accordance with a particular exemplary embodiment of plated terminations 72. It should be appreciated that terminations 72 may comprise only a first plating layer and no additional layers as presented in this example. Due to such potential for variation in the number of plating layers in the multilayer component and termination embodiments of FIGS. 8A and 8B, the two respective embodiments are labeled as 74 and 74' respectively, and such reference is not intended to insinuate additional variations between the two respective embodiments.

A first step in the formation of the terminations illustrated in FIG. 8B involves submersing a component in an electroless plating solution, such as nickel or copper ionic solution, such that a layer of copper 76 or other metal is deposited along the periphery of component 74' where portions of internal anchor tabs 58 and 68, exposed internal electrode tabs extending from electrode layers 52 and 54, and external anchor tabs 70 are exposed. The tab area covered with metallic plating 76 can then be covered with a resistor-polymeric material 78 and then plated again with metallic copper or other material 80. In other exemplary embodiments, termination layer 78 may correspond to a solder barrier layer, for example a Ni-solder barrier layer. In some embodiments, layer 78 may be formed by electroplating an additional layer of nickel on top of an initial electrolessly plated layer 76 (e.g., plated copper). Other exemplary materials for layer 78 include nickel-phosphorus, gold, and silver. A third exemplary termination layer 80 may in some embodiments correspond to a conductive layer, such as plated Ni, Ni/Cr, Ag, Pd, Sn, Pb/Sn or other suitable plated solder.

A still further plating alternative corresponds to forming a layer of metallic plating, and then electroplating a resistive alloy over such metallic plating. Plating layers can be provided alone or in combination to provide a variety of different plated termination configurations. A fundamental of such plated terminations is that the self-determining plating is configured by the design and positioning of exposed conductive portions along the periphery of a component. It should be appreciated that the aforementioned plated terminations having multiple layers are not limited to utilization with the embodiments illustrated in FIGS. 8A and 8B, and may be practiced in accordance with all illustrated, disclosed and otherwise obvious electronic component variations.

Such particular orientation of internal electrode portions and anchor tabs may be provided in a variety of different configurations to facilitate the formation of plated terminations in accordance with the present subject matter. For instance, consider the exemplary internal conductive configuration of FIG. 3B with electrode layers 26 and 28. Electrode tabs 30 and internal anchor tabs 82 may be provided in a body of dielectric material to create a multilayer component similar to that of FIG. 4A. Additional internal anchor tabs 84 and external anchor tabs 86 may also be provided. One of the prescribed plating techniques may then be utilized to form plated terminations on multilayer component 88 along the exposed areas of metallization.

Yet another exemplary multilayer component in accordance with aspects of the present subject matter is represented as component 90 in FIG. 4B. Internal electrode layers are provided with electrode tabs that extend to four sides of component 90. Additional internal anchor tabs 94 may be interleaved with exposed electrode tabs 92. Still further internal anchor tabs 96 may be embedded within cover layers of component 90 to provide for expanded plated terminations. The provision of external anchor tabs 98 could facilitate the formation of wrap-around plated terminations to top and/or bottom sides of the component. Such external anchor tabs 98 may be printed directly into the ceramic plate or tape forming the topmost substrate layer to form an "embedded" layer that is completely flush with the topmost substrate layer. By embedding such portions of the electronic component, terminations may be less susceptible to partial breakage or inadvertent removal and a more aesthetically designed overall component may also be effected.

Examples of different peripheral termination shapes, such as effected by selective arrangement of external anchor tabs, are now presented with reference to FIGS. 10A, 10B, 11A, 11B, 12A and 12C. Referring more particularly to FIG. 10A, a multilayer electronic component 150 has multiple pairs of opposing electrodes embodied by respective first electrodes 152 and respective second electrodes 154. Each electrode layer is formed on a respective ceramic layer, on which at least one anchor tab 156 may also be provided. Additional anchor tabs 158 may also be provided in dielectric cover layers without electrode elements, such that exposed conductive regions are provided along the general entirety of either side of multilayer component 150. By providing the exposed conductive anchor tabs 158 into the cover layers and approaching selected respective corners 157 of the component 150, the formation of generally "I-shaped" terminations 159a and 159b, such as depicted in FIG. 10B is facilitated. Such "I-shaped" terminations provide a land-less termination that still enables good solder wetting to a printed circuit board or other mounting surface, since the terminations preferably extend completely to the top and/or bottom surfaces of component 150.

Referring now to FIGS. 11A and 11B, a multilayer electronic component 160 has multiple pairs of opposing electrodes embodied by respective first electrodes 162 and respective second electrodes 164. Each electrode layer is formed on a respective ceramic layer, on which at least one anchor tab 166 may also be provided. Additional anchor tabs 168 may also be provided in dielectric cover layers without electrode elements, such that exposed conductive regions are provided along the general entirety of either side of multilayer component 160. External anchor tabs 165 are also preferably provided on a selected one of the top and bottom sides of component 160 such that resultant "J-shaped" terminations 169a and 169b are formed in accordance with the subject plating technology. Such "J-shaped" terminations provide lands for mounting the electronic component to a printed circuit board or other mounting surface, and since the lands are only on a selected side of component 108, a predetermined component mounting orientation is provided.

The absence of conductive portions on the top surface is sometimes desirable, for example, when the surface may come in contact with a heat shield or RF shield, which could cause a short circuit.

It should be appreciated in accordance with the above description of FIGS. 11A and 11B, that shorthand characterization of terminations 169a and 169b as generally "J-shaped" should be considered from a generally broad descriptive perspective, and should not be considered limiting to embodiments of the present technology. For example, a "J-shaped" termination can be interpreted in different embodiments to describe terminations formed as either an upper-case "J" or a lower-case "j". A "J"-shaped termination when considered in a lower case "j" embodiment may be regarded as similar to a reversed perspective of an "L" shaped structure, each including two generally perpendicular extended portions. When provided as a termination in the context of certain embodiments of the present subject matter, such a termination may extend along a given peripheral surface while wrapping around to one selected surface adjacent to the given peripheral surface. An upper case "J"-shaped termination may be similar to a lower case "J"-shaped termination in that it includes two generally perpendicular portions, but may further include a portion corresponding to the small crossbar at the top of an upper case "J". When provided as a termination in the context of certain embodiments of the present subject matter, such a termination may have a main portion extending along a given peripheral surface while including lands wrapping around to opposing surfaces adjacent to the given peripheral surface, with one land generally longer than the other land. The longer land may be representative of the bottom base portion of a capital "J", while the shorter land may be representative of the upper crossbar portion.

Referring now to FIGS. 12A and 12B, a multilayer electronic component 170 has multiple pairs of opposing electrodes embodied by respective first electrodes 172 and respective second electrodes 174. Each electrode layer is formed on a respective ceramic layer, on which at least one anchor tab 176 may also be provided. Additional anchor tabs 178 may also be provided in dielectric cover layers without electrode elements, such that exposed conductive regions are provided along the general entirety of either side of multilayer component 170. External anchor tabs 175 are also preferably provided on both top and bottom sides of component 170 such that resultant "U-shaped" terminations 179a and 179b are formed in accordance with the subject plating technology. Such "U-shaped" terminations provide lands for mounting either side of electronic component 170 to a printed circuit board or other mounting surface.

With regard to FIGS. 10B, 11B and 12B, it should be appreciated that the respective terminations 159a, 159b, 169a, 169b, 179a and 179b may be selectively formed as single layer terminations or as multilayer terminations. For example, each peripheral termination in FIGS. 10B, 11B and 12B may correspond to a single layer of plated copper or nickel. Alternatively, such terminations may be formed to have an initial layer of plated copper followed by respective plated solder barrier and solder layers, for example nickel and then tin. In accordance with multilayered terminations, selected of the layers could be formed of a resistive or a semiconductive material.

Figure 15A:
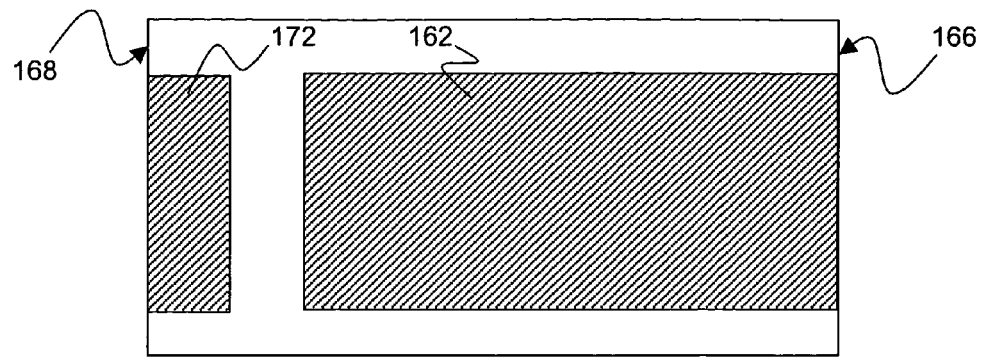
FIGS. 15A and 15B respectively illustrate generally top views of an exemplary rectangular electrode layer configuration in accordance with the present subject matter for use in multilayer capacitor embodiments.
Figure 15B:
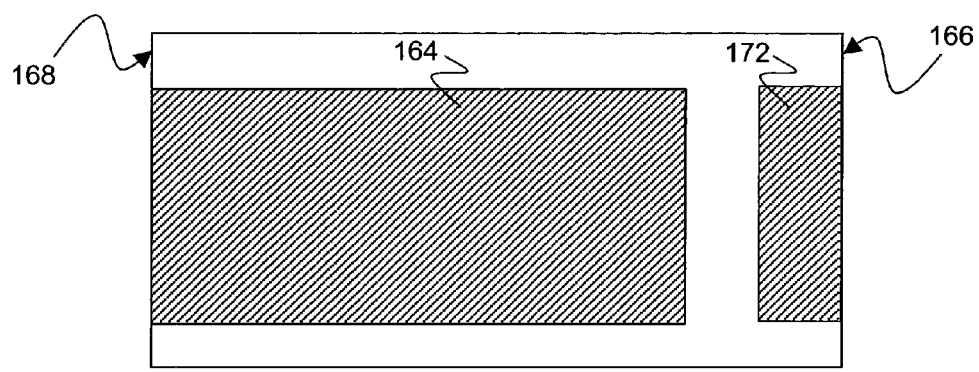
Figure 15C:
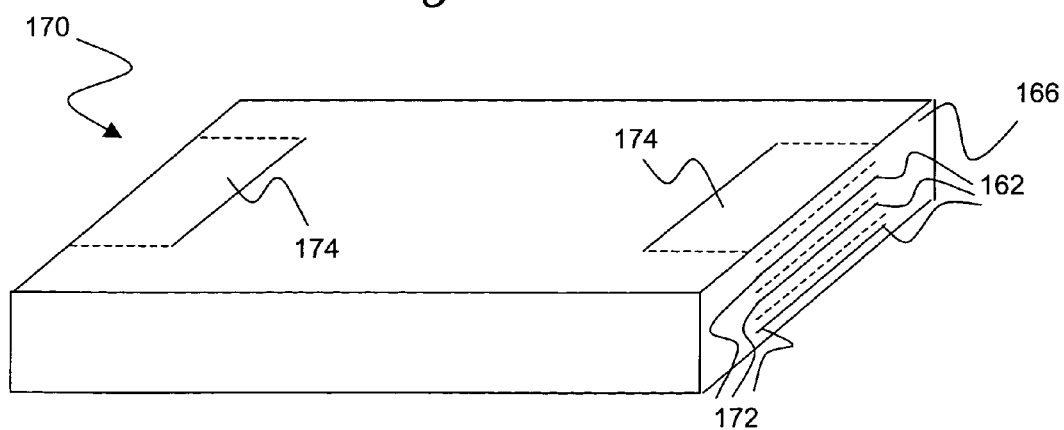
FIG. 15C illustrates a generally side perspective view of an exemplary multilayer capacitor embodiment in accordance with the present subject matter with rectangular electrode layer configurations such as those illustrated in FIGS. 15A and 15B.

A still further application of the presently disclosed technology relates to more general multilayer component configurations, such as depicted in FIGS. 15A, 15B and 15C. Electrode layer 162 of FIG. 15A and electrode layer 164 of FIG. 15B are provided in respective generally rectangular configurations such that when interleaved with dielectric layers to form a multilayer device such as depicted in FIG. 15C, such electrodes 162 and 164 extend to alternating ends 166 and 168 of the multilayer device 170. Anchor tab portions 172 may also be provided within the respective electrode layer planes to increase the density of exposed conductive portions along the ends 166 and 168 of device 170 and to facilitate the formation of plated terminations thereto. External anchor tabs, or lands, 174 may also be provided on top and/or bottom surfaces of device 170 and in alignment with the exposed internal electrode and anchor tab portions to facilitate selected formation of wrap-around terminations to one or more top/bottom surfaces. After subjecting the device 170 to one or more of the plating techniques described herein, the formation of plated terminations in accordance with the present subject matter may be effected. It should be appreciated that additional embodiments of the present subject matter may incorporate similar electrode configurations as illustrated in FIGS. 15A and 15B, where electrode plates 162 and 164 are generally square-shaped instead of rectangular.

Figure 6A:
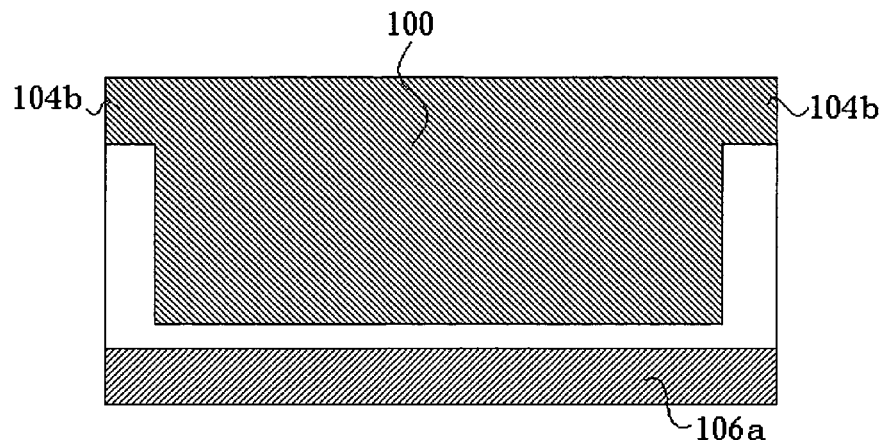
FIGS. 6A and 6B respectively illustrate generally top views of an exemplary "T-shaped" electrode layer configuration in accordance with the present subject matter for use in multilayer capacitor embodiments with corner terminations.
Figure 6B:
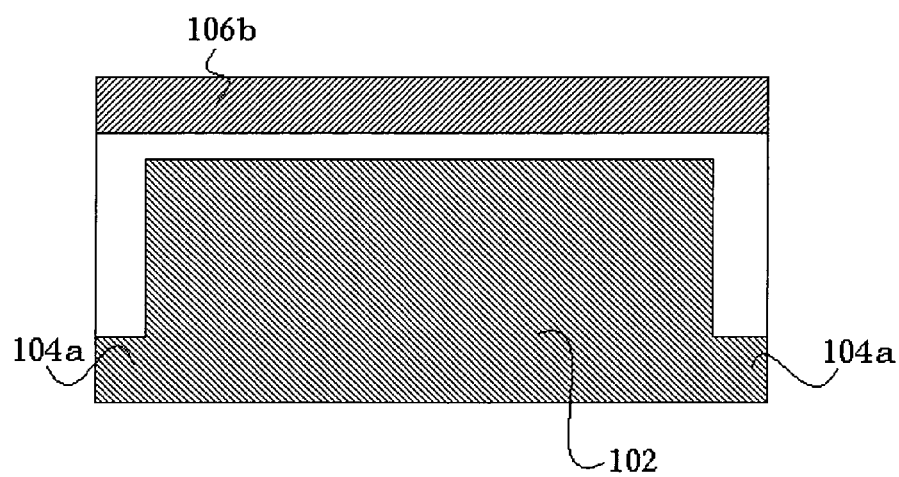
Figure 6C:
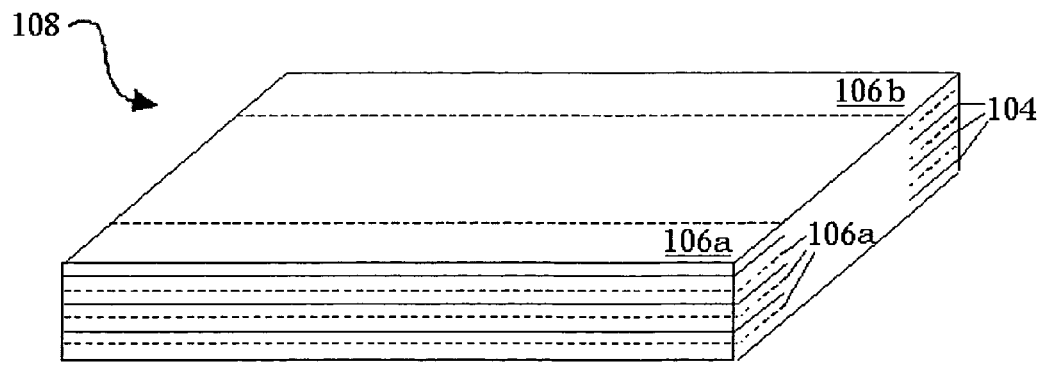
FIG. 6C illustrates a generally side perspective view of an exemplary multilayer capacitor embodiment in accordance with the present subject matter with electrode layer configurations such as those illustrated in FIGS. 6A and 6B.

Yet another exemplary multilayer configuration for use in accordance with embodiments of the present subject matter is illustrated in FIGS. 6A, 6B, 6C, 6D, 6E, 6F and 6G. Electrode layer 100 of FIG. 6A and electrode layer 102 of FIG. 6B are provided in respective T-shaped configurations such that electrode tab portions 104b extend from electrode layer 100 and electrode tab portions 104a extend from electrode layer 102. When electrode layers 100 and 102 are interleaved with dielectric layers to form a multilayer electronic device, such as shown in FIG. 6C, each electrode tab portion 104a and 104b is exposed on two adjacent sides of the device 108. More particularly, the base portion defined between respective tabs 104b and the base portion defined between respective tabs 104a are both exposed along an entire side of device 108 as well as to portions of two respective surfaces adjacent to the given side surface. Anchor tab portions 106a and 106b may also be provided within the electrode layer planes such that exposed conductive portions are aligned along the opposing peripheral sides of device 108, to facilitate formation of plated electrodes thereon. After subjecting device 108 to one of the plating techniques described herein, the formation of corner terminations would be effected. It should be appreciated that provision of such terminations around selected corners of a multilayer electronic component was often difficult to achieve with prior art termination processes. It should be further appreciated by one of ordinary skill in the art that corner-terminated designs can be achieved not only in device 108, but in many other specifically configured devices, and it should further be appreciated that, analogous to the anchor tab discussion above, the corner wrap can be provided on only one corner, when that is desirable, as when an orientation feature may be needed.

Figure 6D:
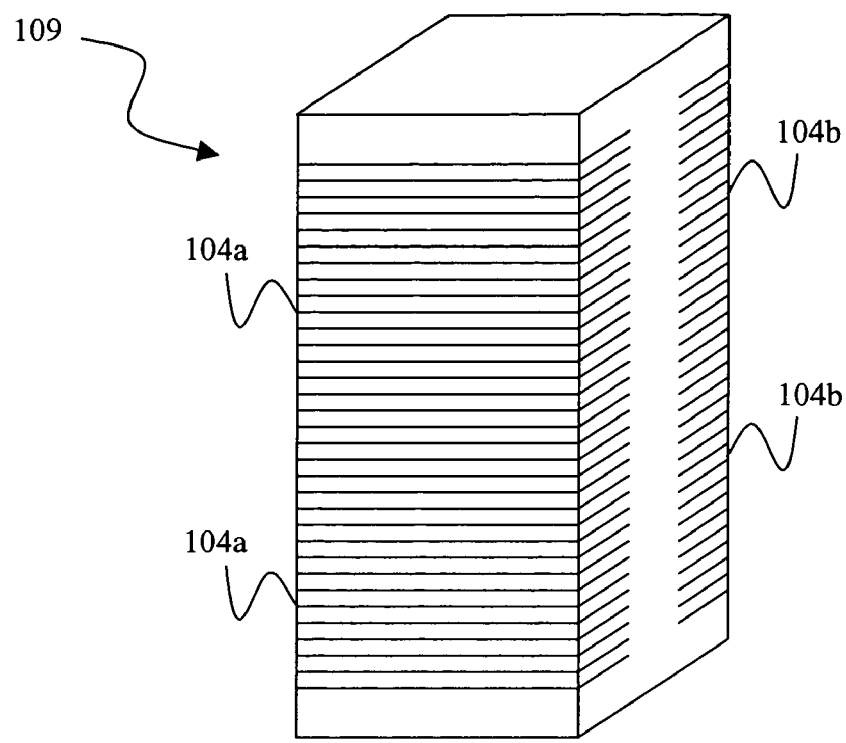
FIGS. 6D and 6F illustrate alternative embodiments of an exemplary multilayer capacitor embodiment similar to FIG. 6C and having electrode layer configurations such as those illustrated in FIGS. 6A and 6B.
Figure 6E:
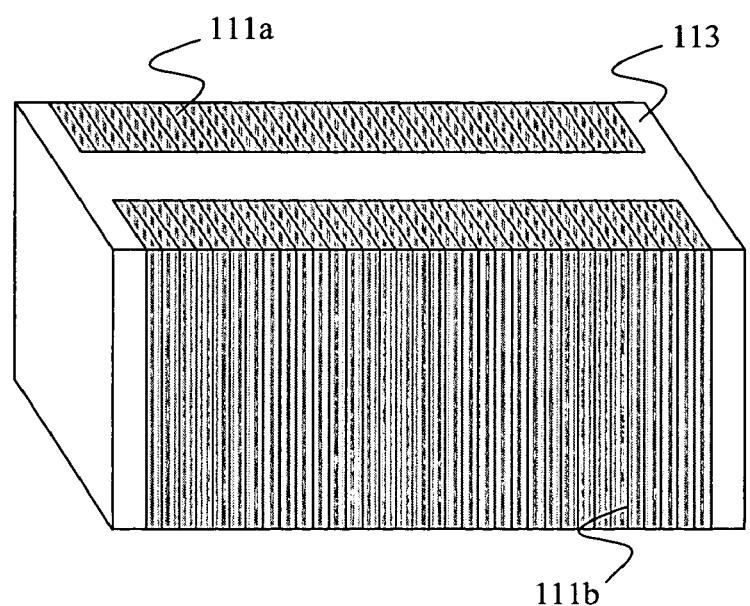
FIG. 6E illustrates the embodiment of FIG. 6D with plated terminations applied in accordance with the present subject matter and further depicted in an exemplary orientation for mounting the embodiment to a substrate.

A further advantage of the exemplary configuration illustrated in FIG. 6C may be realized when many more dielectric and electrode layers are stacked to form an assembly 109 as depicted in FIG. 6D. Similar to FIG. 6C, a plurality of first electrodes 104a (and optionally including additional anchor portions 106a) are exposed in a column along one side of the device 109 while a plurality of second electrodes 104b (and optionally additional anchor portions 106b) are exposed along the side of device 109 opposing the side at which first electrodes 104a are exposed. Each electrode portion 104a and 104b (and any corresponding optional anchor portions 106a and/or 106b) may actually be exposed along an entire side of device 109 and onto two adjacent side surfaces. This unique stacked assembly 109 may then be terminated in accordance with the disclosed plating technology to form two terminations 111a and 111b as illustrated in FIG. 6E. The assembly 109 depicted in FIG. 6D is flipped to its side as depicted in FIG. 6E to be configured for mounting to a substrate. The unique corner terminations 111a and 111b effected in such assembly enable both side surface 113 and the surface opposing side surface 113 to be equally capable of mounting to a surface, thus providing component orientation and mounting versatility.

Figure 6F:
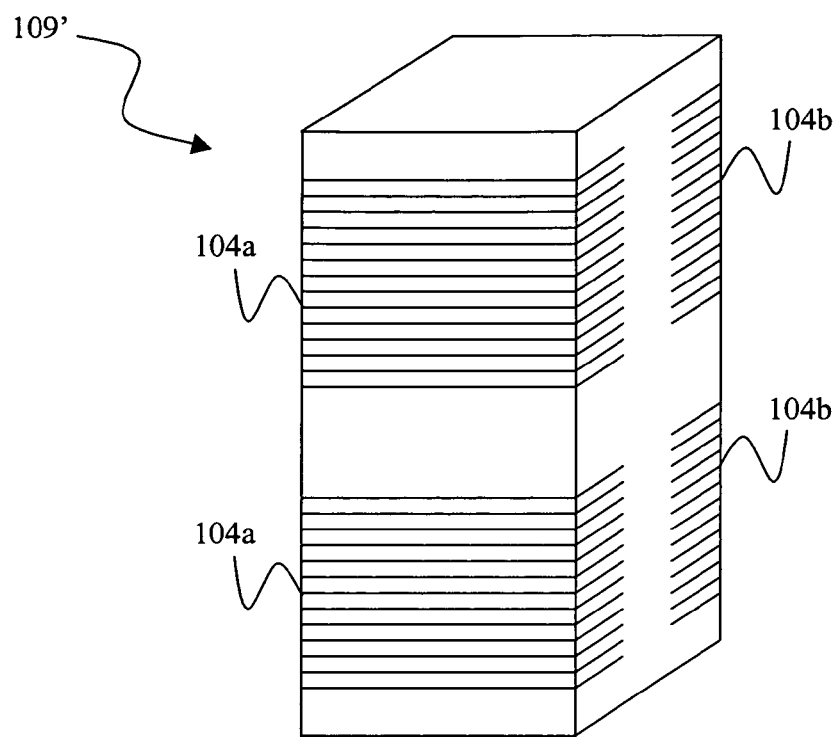
Figure 6G:
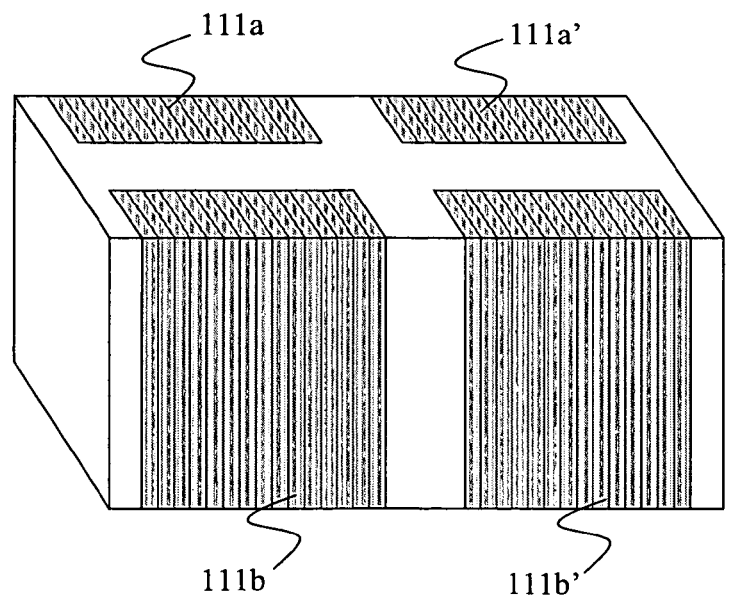
FIG. 6G illustrates the embodiment of FIG. 6F with plated terminations applied in accordance with the present subject matter and further depicted in an exemplary orientation for mounting the embodiment to a substrate.

Referring now to FIGS. 6F and 6G, it should be appreciated that the exemplary electrodes and corner terminations illustrated and discussed with reference to FIGS. 6A-6E are not limited to one termination 111a of a first polarity and one termination 111b of a second polarity. As illustrated in FIG. 6F, such electrodes 104a and 104b may be selectively interleaved with dielectric layers (with or without additional anchor tab portions 106a and 106b) to form distinct columns of exposed conductive portions. In accordance with the "self-determining" plating technology of the present subject matter, such distinct exposed areas may result in the formation of multiple first terminations 111a and 111a' and multiple second terminations 111b and 111b'. It should be appreciated that many more than two or four terminations per assembly (as illustrated herein) may be effected.

Figure 16A:
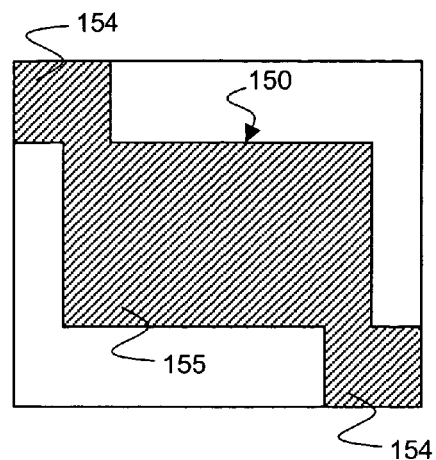
FIGS. 16A and 16B respectively illustrate generally top views of an exemplary electrode layer configuration for effecting opposing corner terminations for use in multilayer capacitor embodiments in accordance with the present subject matter.
Figure 16B:
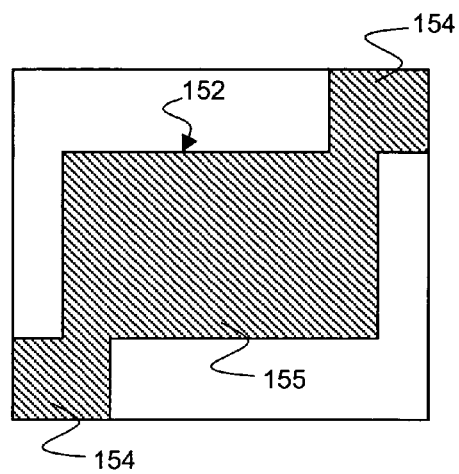
Figure 16C:
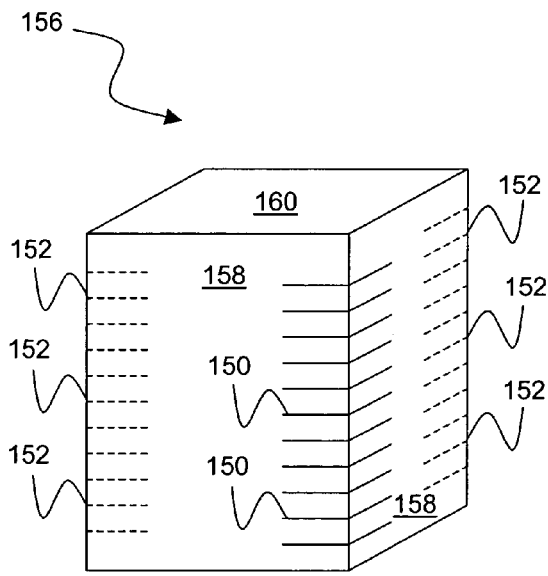
FIG. 16C illustrates a generally side perspective view of an exemplary multilayer capacitor embodiment with electrode layer configurations such as illustrated in FIGS. 16A and 16B in accordance with the present subject matter.
Figure 16D:
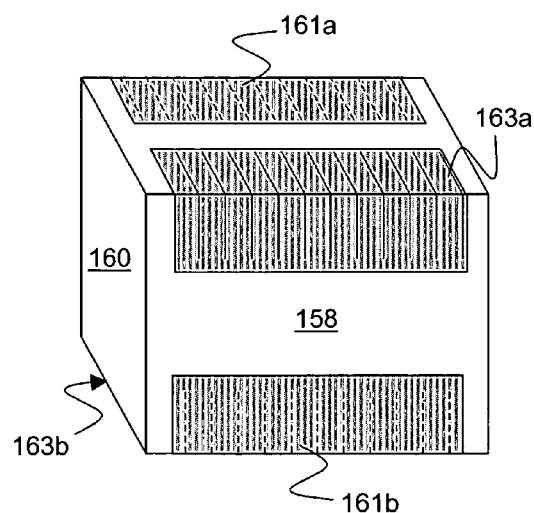
FIG. 16D illustrates a generally side perspective view of the exemplary multilayer capacitor embodiment of FIG. 16C provided with plated terminations in accordance with the present subject matter and oriented in an exemplary mounting configuration.

Yet another example of a corner-terminated multilayer electronic device is illustrated in FIGS. 16A–16D, respectively. Electrode layer 150 of FIG. 16A and electrode layer 152 of FIG. 16B are provided in respective configurations such that generally rectangular tab portions 154 are provided at opposing corners of respective generally rectangular base portions 155. When electrode layers 150 and 152 are interleaved with dielectric layers to form a multilayer device 156, such as shown in FIG. 16C, respective corner tab portions 154 of the set of electrode layers 150 (depicted in FIG. 16C by solid lines) are exposed for termination at opposite corners of the device 156 while the respective corner tab portions of the set of electrode layers 152 (depicted in FIG. 16C by dashed lines) are exposed at the other two corners. When such a device 156 of FIG. 6C is subjected to the plating technology disclosed herein, a plurality of terminations 161a, 161b, 163a and 163b are formed at the periphery of such device as illustrated in FIG. 16D. Flipping the terminated device on its side for mounting allows all electrodes to be accessed from any of the four generally larger side surfaces 158 of device 156, allowing any of such four side surfaces 158 to be mounted to a substrate. It should be appreciated that each corner termination 161*a*, 161*b*, 163*a* and 163*b* need not be one continuous termination as illustrated in FIG. 16D. Alternatively, selective arrangements of internal electrodes 150 and 152 may result in one or more columns per corner such as represented by the embodiment of FIGS. 6F and 6G.

The electrode and corresponding capacitor design of FIGS. 16A–16D allows for much greater freedom of orientation in surface mount devices, which may be of particular advantage in some exemplary embodiments of the present subject matter since reduced component size sometimes increases potential difficulty in achieving proper device orientation for testing, tape/reel and pick/place applications, and actual device mounting. These advantages may be realized for generally rectangular devices, but greater orientation insensitivity may be achieved when the cross section of device 156 (as defined by top and bottom surfaces 160) are defined by a generally square shape. As mentioned above with regard to the corner terminations of FIGS. 6A–6C, it should be appreciated that utilization of plated terminations with the exemplary embodiment of FIGS. 16A–16D provides additional advantage since provision of corner terminations with previous printing technologies was often difficult, especially in smaller components. Although not illustrated in the embodiments of FIGS. 16A–16D, it should be appreciated that the illustrated electrode configuration may be supplemented by anchor tab portions (such as generally "L"-shaped or triangular corner tabs) in the active and/or cover layers and/or serving as external lands of the device to provide additional nucleation points for forming plated terminations in accordance with the disclosed technology.

Figure 13A:
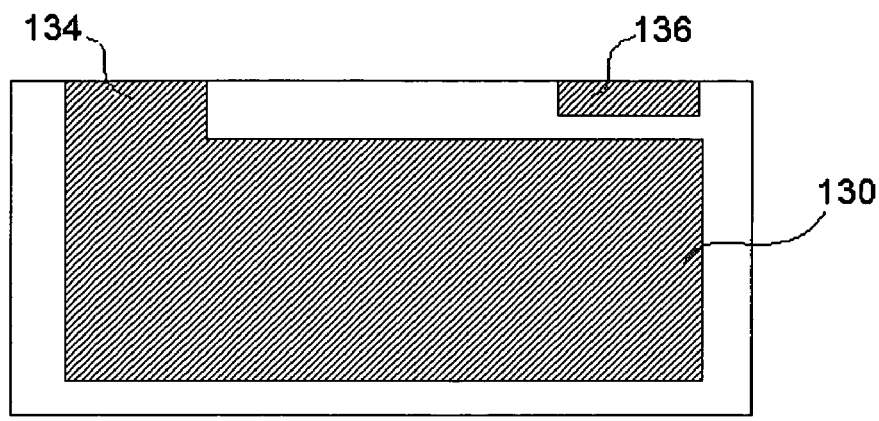
FIGS. 13A and 13B respectively illustrate generally top views of an exemplary "J-shaped" electrode layer configuration in accordance with the present subject matter for use in multilayer capacitor embodiments.
Figure 13B:
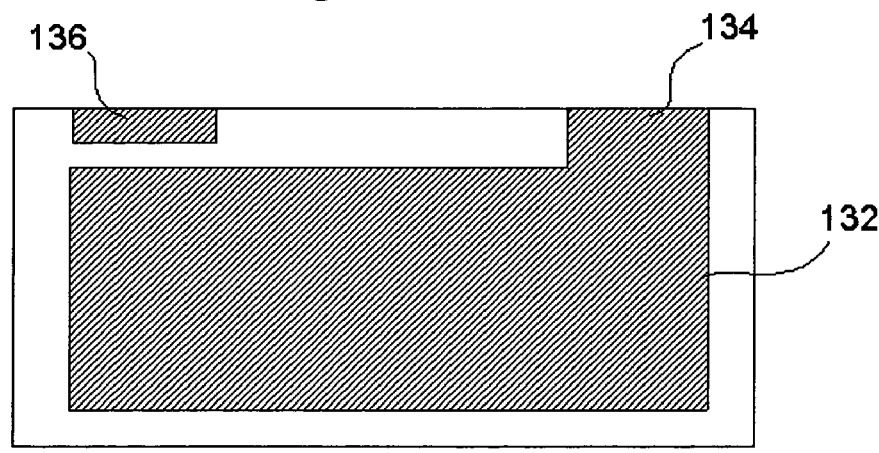
Figure 13C:
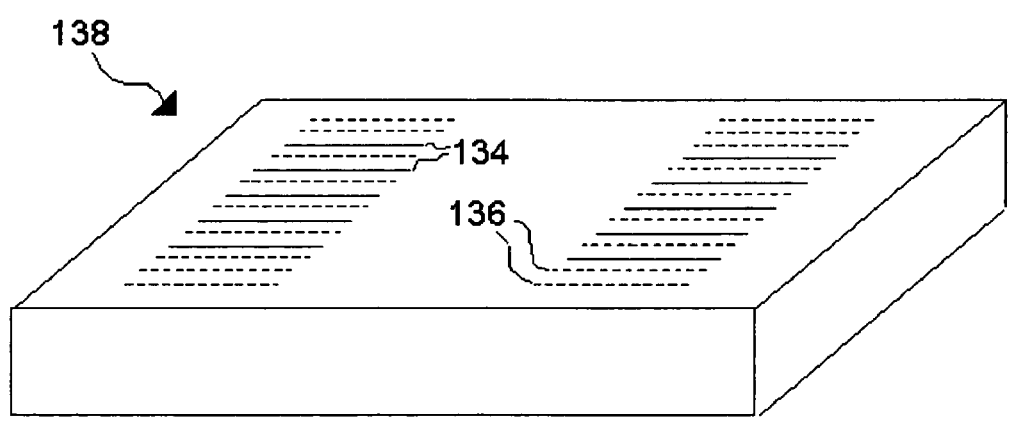
FIG. 13C illustrates a generally side perspective view of an exemplary multilayer capacitor embodiment in accordance with the present subject matter with "J-shaped" electrode layer configurations such as those illustrated in FIGS. 13A and 13B.

Yet another example of a multilayer electronic component with which the presently disclosed technology may be utilized is depicted in FIGS. 13A, 13B and 13C. Electrode layer 130 of FIG. 13A and electrode layer 132 of FIG. 13B are provided in respective J-shaped configurations such that electrode tab portions 134 extend from the respective electrode layers. When electrode layers 130 and 132 are interleaved with dielectric layers and stacked to form a multilayer ceramic device, such as shown in FIG. 13C, each electrode tab portion 134 (represented by an respective solid line) is exposed at selected locations along the top side of the device 138. Anchor tab portions 136 may also be provided within the electrode layer planes and/or within dielectric cover layers such that additional exposed conductive portions (as depicted by the respective dashed lines in FIG. 13C) may facilitate formation of plated electrodes thereon. Components that utilize "J-shaped" electrodes as depicted in FIGS. 13A–13C have the advantage in certain applications of having inherently predetermined component orientation, since terminations are formed only on one side of the component.

Figure 14A:
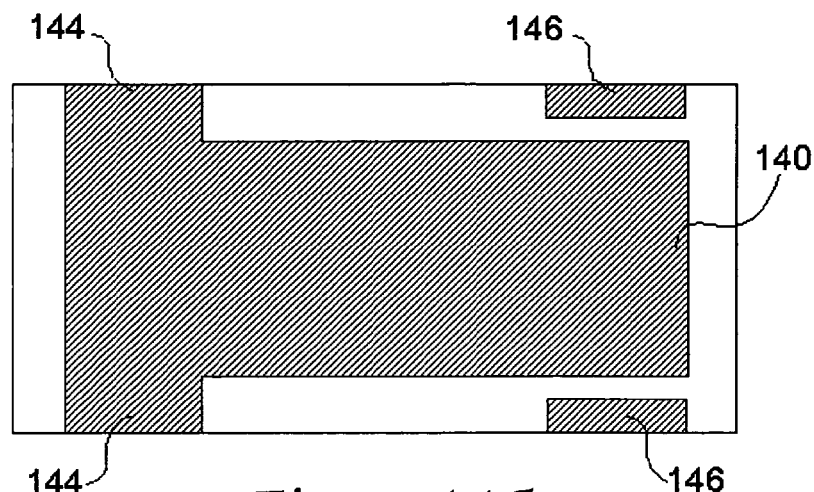
FIGS. 14A and 14B respectively illustrate generally top views of an exemplary "T-shaped" electrode layer configuration in accordance with the present subject matter for use in multilayer capacitor embodiments.
Figure 14B:
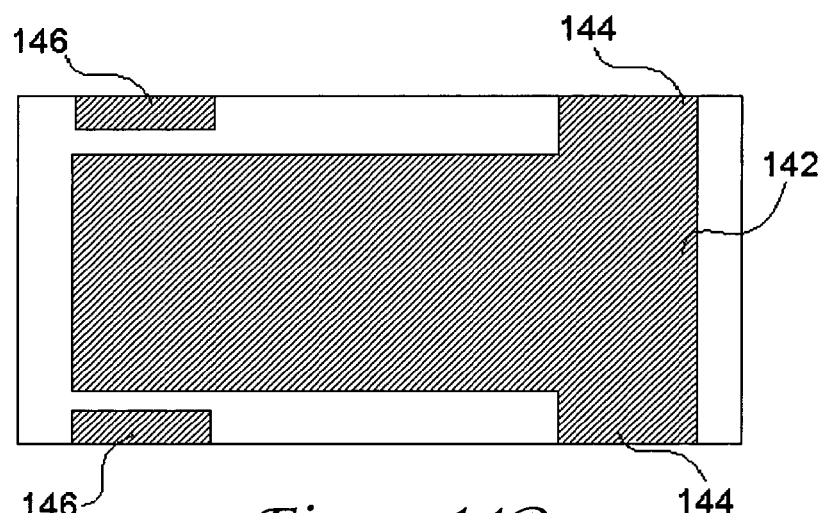
Figure 14C:
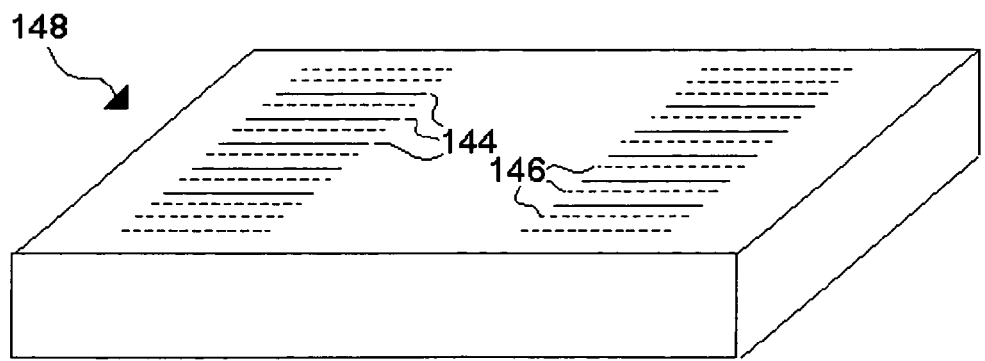
FIG. 14C illustrates a generally side perspective view of an exemplary multilayer capacitor embodiment in accordance with the present subject matter with "T-shaped" electrode layer configurations such as those illustrated in FIGS. 14A and 14B.

A slight variation to the "J-shaped" electrodes illustrated in FIGS. 13A–13C, respectively, corresponds to the "T-shaped" electrodes embodied in FIGS. 14A, 14B and 14C. Electrode layer 140 of FIG. 14A and electrode layer 142 of FIG. 14B are provided in respective T-shaped configurations such that electrode tab portions 144 extend from the respective electrode layers. When electrode layers 130 and 132 are interleaved with dielectric layers and stacked to form a multilayer ceramic device, such as shown in FIG. 14C, each electrode tab portion 144 (represented by an respective solid line) is exposed at selected locations along both top and bottom sides of the device 148. Anchor tab portions 146 may also be provided within the electrode layer planes and/or within dielectric cover layers such that additional exposed conductive portions (as depicted by the respective dashed lines in FIG. 14C) may facilitate formation of plated electrodes thereon.

Figure 17A:
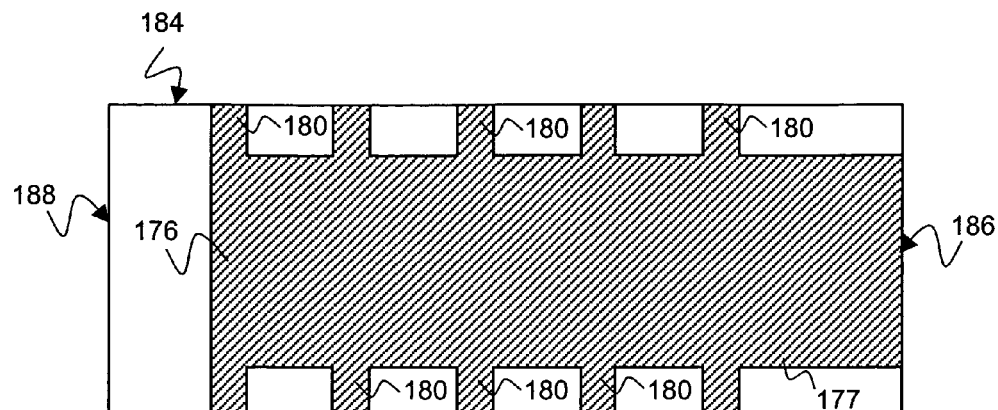
FIGS. 17A and 17B respectively illustrate generally top views of an exemplary electrode layer configuration with multiple side tabs and extended end portions for use in multilayer capacitor embodiments in accordance with the present subject matter.
Figure 17B:
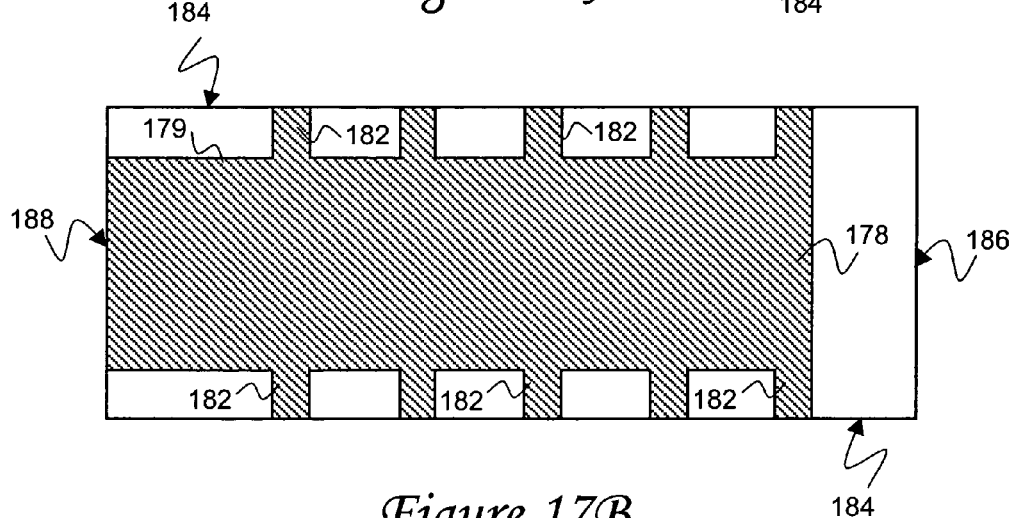
Figure 17C:
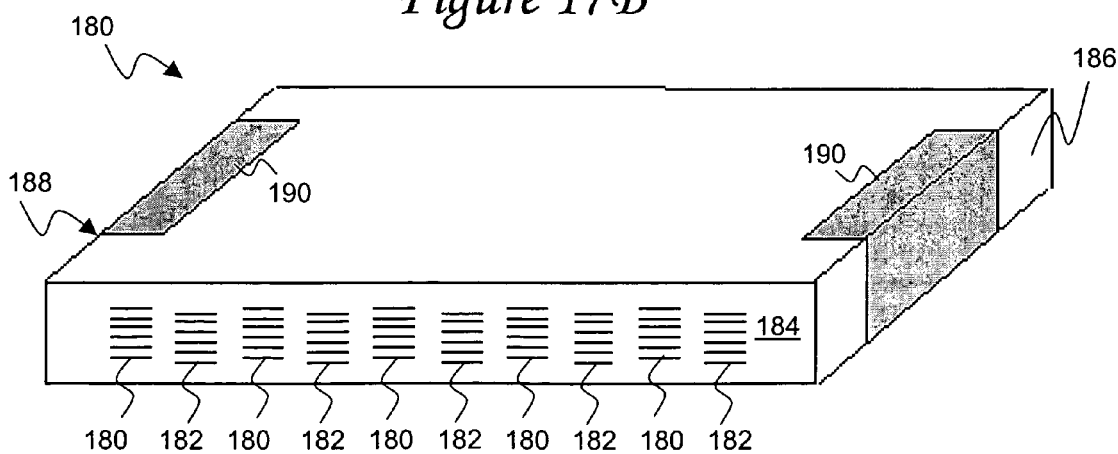
FIG. 17C illustrates a generally side perspective view of an exemplary multilayer capacitor embodiment with embedded electrode layer configurations such as illustrated in FIGS. 17A and 17B in accordance with the present subject matter.
Figure 18:
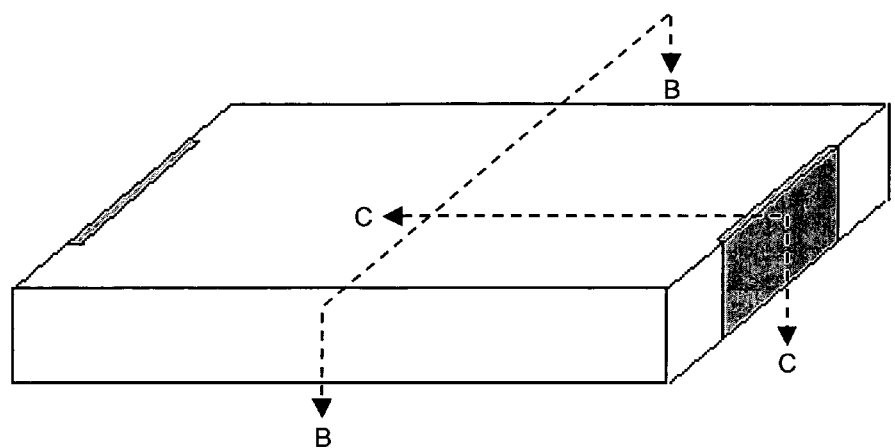
FIG. 18 depicts an exemplary terminated multilayer capacitor in accordance with the presently disclosed technology.

A still further exemplary device configuration for use with the subject plated termination technology is depicted in FIGS. 17A, 17B and 17C. Multiple electrode layers 176 such as depicted in FIG. 17A and electrode layers 178 such as depicted in FIG. 17B are interleaved with a plurality of dielectric layers to form a multilayer device 180 such as depicted in FIG. 17C. Each respective electrode layer 176 and 178 has a plurality of electrode tabs extending therefrom which are exposed at selected locations along the generally longer sides 184 of device 180. The extended portions 177 of each electrode layer 176 are exposed in an aligned column at side 186 of device 180 while the extended portions 179 of each electrode layer 178 are exposed in an aligned column at side 188 of the device. It should be appreciated that although not illustrated in FIGS. 17A-17C, anchor tabs may supplement the electrode layers 176 and 178 in the active and/or cover layers and/or serving as external lands of the device to provide additional nucleation points for forming plated terminations in accordance with the disclosed technology.

There are a relatively high number of exposed conductive portions in the multilayer device embodiment of FIG. 17C. Electroless plating techniques and others as previously described herein may be utilized to form plated terminations at the exposed conductive portions, but it may be difficult in some embodiments to utilize only electroplating or electrochemical deposition techniques when the intended number of terminations is high and/or termination pitch and/or termination size is relatively small. Referring to the device of FIG. 17C, electroplating techniques require that each exposed conductive portion (portions 180 and 182 as well as the exposed ends 177 and 179 of electrode layers 176 and 178) must be electrically biased for the electrolytic plating solution to be attracted to and deposited at the exposed conductive portions. If only some of the conductive portions are biased, termination formation may not bridge across all exposed portions in one or more aligned columns. In order to make electroplating a more viable option for the device 180 of FIG. 17C, printed end terminations 190 may be applied to the extended respective end portions 177 and 179 of electrode layers 176 and 178 at the device sides 186 and 188. Printed end terminations 190 would form two collective electrical connections for the respective electrode layers of opposing polarities. Such terminations may correspond to the relatively thick-film stripes conventionally applied to terminate electronic devices and may wrap around to one or more selected sides of the device if desired. The device 170 with printed terminations 190 may then be subjected to an electroplating solution, and as long as the terminations 190 are biased, then each exposed conductive portion 180 and 182 will also be energized such that plating material will be deposited thereon. This method can serve to greatly reduce the possibility of plated terminations not forming at one or more exposed conductive portion 180 and 182 during electroplating techniques.

Figure 9A:
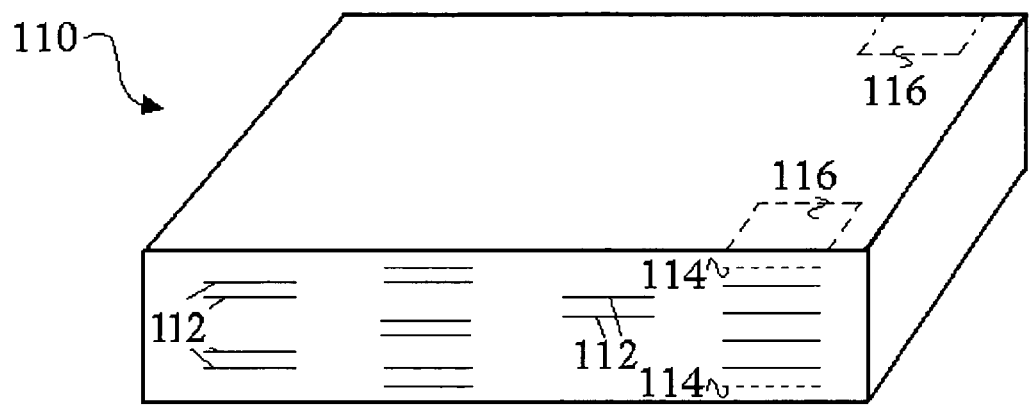
FIG. 9A illustrates a generally side view, with slight top perspective, of an exemplary monolithic integrated passive component with exposed electrode tabs and additional anchor tabs in accordance with the disclosed technology.
Figure 9B:
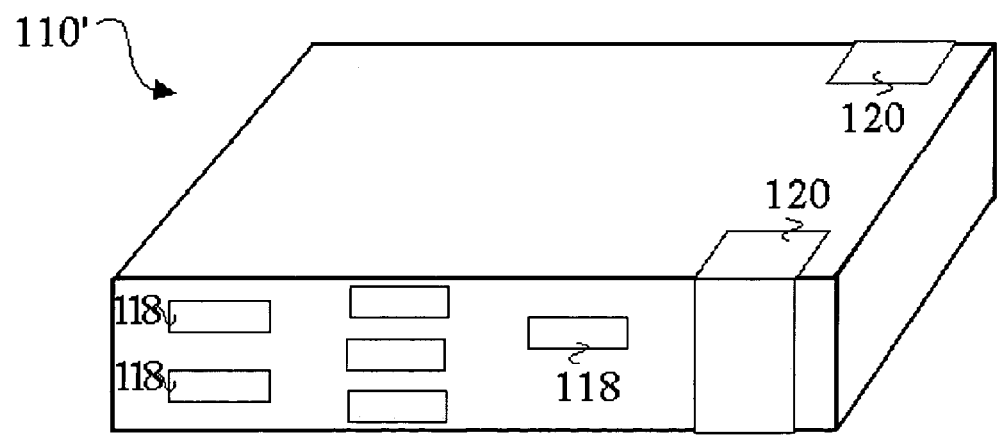
FIG. 9B illustrates a generally side view, with slight top perspective, of an exemplary monolithic integrated passive component with plated terminations in accordance with the present subject matter.

Another example embodying aspects of the disclosed technology is presented with respect to FIGS. 9A and 9B. FIG. 9A represents an integrated passive component 110, comprising a combination of passive components provided in a single monolithic structure. Integrated component 110 may include a selected combination of resistors, varistors, capacitors, inductors, couplers, baluns, and/or other passive components. Each distinct passive component is typically characterized by at least one conductive electrode-like portion from which at least one electrode tab portion 112 extends and is exposed along the periphery of component 110.

An integrated passive component 110, such as that represented by FIG. 9A, may have a plurality of different internal electrode arrangements as shown. Corresponding electrode tabs 112 may be provided in symmetrical or nonsymmetrical configurations and may be grouped in a variety of fashions. An important feature is that exposed electrode tabs 112 may be arranged within component 110 to facilitate the formation of selective plated terminations. In addition, internal anchor tabs 114 and/or external anchor tabs 116 may also be provided with an integrated passive component to create additional selective termination arrangements. For example, consider the exposed tab arrangement of FIG. 9A, with numerous exposed internal electrode tabs 112, internal anchor tabs 114, and external anchor tabs 116. Subjecting such configuration to a plating solution in accordance with variations of the presently disclosed technology would preferably effect the formation of a plurality of plated side terminations 118 and plated wrap-around terminations 120, such as in FIG. 9B. Integrated passive component, or multilayer electronics device, 110' simply corresponds to an integrated passive component such as 110 of FIG. 9A with the addition of plated terminations 118 and 120, respectively. Thus, tabs of an integrated passive component can be designed whereby plated terminations can be formed among different electrodes and different component layers.

Figure 21A:
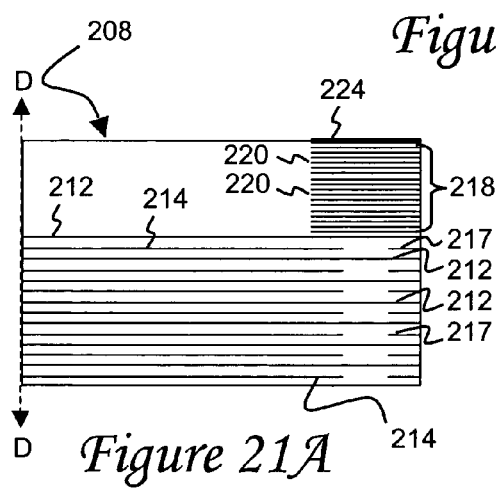
FIGS. 21A and 21B respectively illustrate exemplary cross-sections of the multilayer capacitor of FIG. 20 taken along lines D—D and E—E, specifically depicting the general shape of selected device corners before and after corner rounding of the capacitor device.
Figure 21B:
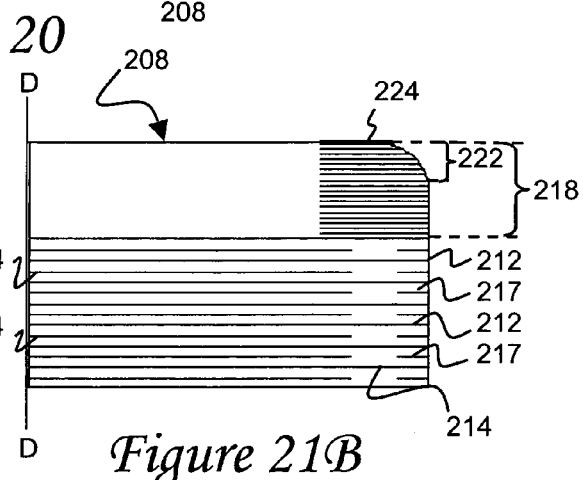
Figure 21C:
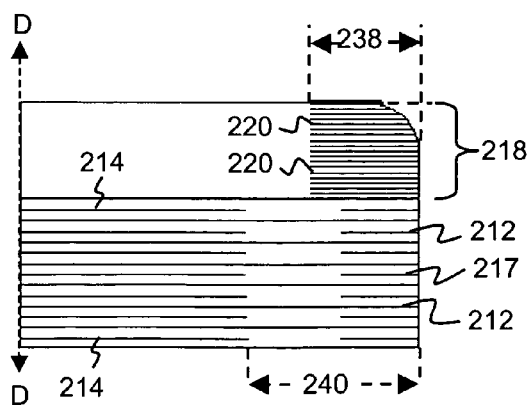
FIG. 21C illustrates an exemplary cross-section of the multilayer capacitor of FIG. 20 taken along lines D—D and E—E, specifically depicting an exemplary length relationship between the cover layer anchor tabs and the capacitor end margin.

Referring now to FIGS. 20, 21A–21C and 22, various additional aspects of the present subject matter will now be discussed. FIGS. 21A, 21B and 21C illustrate different exemplary cross-sections of multilayer capacitor 208 taken along the planes defined by lines D—D and E—E. The cross sections of FIGS. 21A, 21B and 21C illustrate the generally shorter side of capacitor 208 when delineated by line D—D on which exemplary termination 210b might be formed and the upper portion defined by line E—E. Although FIGS. 21A–21C reference one particular device corner, it should be appreciated that many multilayer devices are formed in a substantially symmetrical fashion in one or more dimensions and thus the illustrated portions may actually be representative of multiple edges/corners of multilayer device 208. FIGS. 21A–21C do not illustrate end terminations 210a and 210b depicted in FIG. 20, but illustrate the exposed conductive portions that could lead to formation of such terminations in accordance with the subject plated termination technology.

FIGS. 21A and 21B illustrate the effects of corner rounding on an electronic component. "Corner rounding" is yet another step that may be implemented before actual termination plating in accordance with the present technology in order to effect general rounding of previously sharp edges of an electronic component. Such rounding may promote better termination coverage and device uniformity among parts, as well as reduce potential chipping that might come from handling multiple components having the sharp edges in bulk. In accordance with such "corner rounding", a plurality of electronic components may be subjected to a predefined level of mechanical agitation either while in the green state, usually with a soft media or none at all, or while in the fired state with media and/or water. This process when applied to components in a fired state is sometimes referred to by those of ordinary skill in the art as "harperizing".

A representation of such corner rounding is presented in a before and after comparison of FIGS. 21A and 21B. In the multilayer component portions of FIGS. 21A and 21B, multiple pairs of opposing first electrode layers 212 and second electrode layers 214 are interleaved among a plurality of dielectric layers to form the active region of a capacitor 208. Anchor tabs 217 may also be provided in such active region to increase the density of exposed conductive portions along selected areas of the active region periphery. A cover layer (generally represented as region 218) may be provided at top and/or bottom surfaces of the active region of capacitor 208. A cover layer may consist of multiple layers of dielectric material (e.g., ceramic sheets) among which anchor tabs 220 may be provided. By arranging anchor tabs in the cover layers such that they are exposed at the device periphery, similar to the first and/or second electrode layers 212 and 214, plated terminations can be deposited along the entire height of the capacitor 208.

Referring to FIG. 21B, it should be noted that a level of mechanical agitation to round the corners of capacitor 208 can be controlled in order to provide anchor tabs 220 having predetermined length(s) in the corner radius portion 222 of the device. Predetermined agitation variables such as duration and effectiveness may be predetermined to achieve different results. For instance, longer agitation times might result in higher levels of corner rounding while less agitation could reduce potential component wear. One portion of multilayer electronic components that is often more susceptible to mechanical abrasion associated with a corner rounding process are external anchor tabs, or lands, 224 which may be provided on a device to facilitate wrap-around terminations. For at least this reason, external anchor tabs 224 are often formed with a greater thickness than internal anchor tabs. For example, in some embodiments, internal anchor tabs such as tabs 217 in the active layers or tabs 220 in the cover layers as well as internal electrodes 212 and 214 may be characterized by an exemplary thickness of about two μm or less, while external lands 224 may be characterized by an exemplary thickness of about five μm or more. In general, the thickness of external lands 224 may be about two times the thickness of internal electrodes and/or anchor tabs for added robustness when a resultant electronic component is to be subjected to mechanical agitation associated with corner rounding or harperizing.

One option for reducing the exposure of the subject components to corner rounding or harperizing would be to dice the components such that less or no tumbling is required to achieve generally rounded device corners. For example, referring to FIGS. 23A–23C, respectively, it should be appreciated and known by one of ordinary skill in the art that capacitors in accordance with the present invention are typically manufactured in a bulk process whereby relatively large capacitor arrays are assembled and then diced to form individual components. FIG. 23A represents an exemplary portion 226 of such a capacitor array that enables one to see how the internal conductive portions 228 may be formed that are cut to provide anchor tabs 230 for more than one multilayer capacitor. Instead of conventional component dicing which may be effected by a substantially straight line depicted at 232 in FIG. 23A, the dicing could correspond to a "V"-type cut, such as represented at cut(s) 234 in FIG. 23B. A "V"-type cut would serve to angle the corners of the component such that much less tumbling or harperizing would be needed to achieve a capacitor 236 with rounded corners as depicted in FIG. 23C. Furthermore, the external lands 224 may not need to be quite as thick as otherwise needed to survive corner rounding.

Yet another design aspect that may be practiced in some embodiments of the present technology to achieve increased mechanical robustness of a device, which becomes especially desirable when tumbling or harperizing of a device is effected, corresponds to the inclusion of certain amounts of ceramic in the material forming the conductive portions of an electronic device. For example, in a multilayer ceramic capacitor, the internal electrode layers and internal and/or external anchor tabs may each be respectively formed of a certain volume percentage (vol %) of conductive ink (e.g., nickel (Ni), Copper (Cu), etc.) and a certain vol % of ceramic. It should be appreciated that some conductive portions may be formed with up to 75 vol % ceramic (and a corresponding counter vol % of conductive ink such that the two percentages combine to 100 vol %). It should be appreciated that somewhat of a tradeoff exists in the combination of ceramic and conductive ink: higher vol % ceramic helps achieve increased robustness but to a loss of conductivity by reduced levels of the conductive ink. In more specific exemplary embodiments, internal electrodes and/or internal anchor tabs are formed with conductive ink (e.g., Ni ink)) combined with about 20 vol % ceramic (e.g., barium titanate). Adding ceramic to such conductive portions helps control electrode shrinking when a part is fired during manufacturing. External anchor tabs (lands) may include even more vol % ceramic than the internal conductive portions, such as on the level of about 30 vol % ceramic. As conductive portions of the subject capacitors are formed with increasing percentages of ceramic material, decreased ceramic powder particle size, such as less than about 1 μm, may facilitate adherence of the ceramic and conductive materials. Although increasing the ceramic content generally increases the adhesion of the printed material, it does reduce the conductivity of that layer. This is not critical, however, as the subsequent plating of pure materials will be very conductive again.

Referring now to FIG. 21C, a multilayer device in accordance with the present subject matter is depicted with an exemplary dimensional relationship among specific components. In the device of FIG. 21C, the length 238 of anchor tabs 220 in the cover layer 218 is less than the length of the end margin 240 between the device periphery and the electrode layers 214. When cover layer anchor tab length 238 is the same or longer than end margin length 240 (such as the instances illustrated in FIGS. 21A and 21B) a potential risk may exist of the anchor tabs 220 shorting with one or more of the upper second electrodes 214. This risk is greatly reduced in the embodiment of FIG. 21C. If the anchor tabs 220 or 217 come into contact internally with any of the first electrodes 212, device functionality will not be effected since those conductive portions will all be coupled together anyways upon the formation of external terminations.

Figure 22:
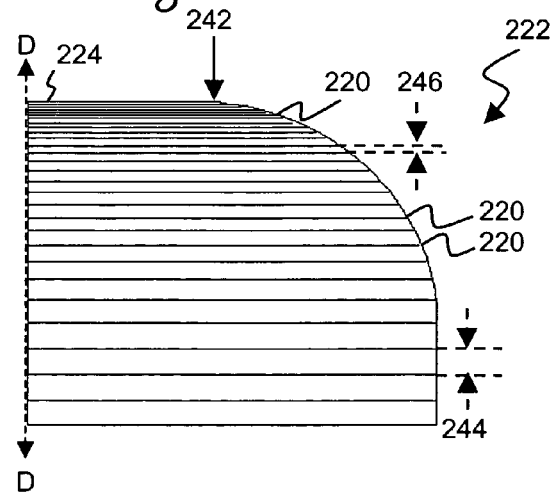
FIG. 22 illustrates a close-up view of an exemplary cross-section of the multilayer capacitor taken along lines D—D and E—E, specifically depicting the placement of cover layer anchor tabs in an incrementally close relationship towards top and/or bottom surfaces of the capacitor.

Referring now to FIG. 22, another aspect of corner rounding in multilayer electronic components will now be presented. FIG. 23 generally represents a corner radius portion 222 of a cover layer portion 218 such as illustrated in FIG. 21B. It is visually illustrated in FIG. 21B that when a device corner is rounded, the distance between exposed locations of adjacent cover layer anchor tabs 220 increases towards the top of a device. In order to maintain a more constant lateral exposure of anchor tabs (or common active layers or whatever conductive portions may be internally provided near top and/or bottom surfaces of a multilayer electronic component), the density of such anchor tabs 220 may be increased towards the top surface 242 of the device. For example distances between anchor tabs closer to the top surface 242 (such as distance 246) are less than distances (such as distance 244) between anchor tabs further from the top surface 242.

It should be appreciated that the monolithic component embodiments illustrated in and discussed with reference to the present figures are provided merely as examples of the disclosed technology, including intermediate aspects thereof. In some of the examples, four or more general columns of electrodes are depicted, but a fewer or greater number of electrode columns are possible, depending on the desired component configuration. Furthermore, many different variations of the exemplary electrode configurations presented herein may be implemented, and thus such examples should not be limiting to the type of structures with which the subject plated termination technology may be employed. It is possible to form plated terminations along any selected portion of any selected component side in accordance with the disclosed technology.

It should be appreciated that internal anchor tabs and external anchor tabs may selectively be used for different termination preferences to provide different sizes of side terminations or wrap-around terminations. IDC embodiments displayed and described herein that feature both internal and external anchor tabs may, for instance, only utilize internal anchor tab features when wrap-around terminations are not preferred for a particular application. Different combinations, geometries, or sizes of both internal and external anchor tabs with existing exposed electrode tabs on a variety of different multilayer components can yield numerous potential termination schemes for a device.

While the present subject matter has been described in detail with respect to specific embodiments thereof, it will be appreciated that those skilled in the art, upon attaining an understanding of the foregoing may readily adapt the present technology for alterations to, variations of, and equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed:

1. A multilayer electronic component, comprising:
a plurality of dielectric layers, each dielectric layer being delimited laterally by edges;
a plurality of internal electrode elements interleaved among selected of said plurality of dielectric layers, wherein selected portions of said plurality of internal electrode elements extend to and are exposed along at least one edge of said plurality of dielectric layers, said interleaved combination of electrode elements and dielectric layers forming a monolithic assembly characterized by respective topmost and bottommost surfaces; and
a plurality of internal anchor tabs interleaved among selected of said plurality of dielectric layers and exposed along selected edges of said plurality of dielectric layers.

2. The multilayer electronic component of claim 1, wherein the exposed portions of said plurality of internal electrode elements and the exposed portions of said plurality of internal anchor tabs are aligned in one or more columns at selected edges of the multilayer electronic component.

3. The multilayer electronic component of claim 2, wherein each exposed internal electrode element portion and each exposed internal anchor tab portion aligned in a given column is exposed along the periphery of said multilayer electronic component at a distance less than about eight microns from at least one other of the exposed internal electrode element portions and exposed internal anchor tab portions in said given column.

4. The multilayer electronic component of claim 2, wherein the distance between selected adjacent internal electrode elements and internal anchor tabs is closer towards said topmost and bottommost surfaces of the monolithic assembly than at the inner layers of said assembly.

5. The multilayer electronic component of claim 2, further comprising at least one layer of plated termination material formed along selected of the one or more aligned columns of exposed internal electrode elements and internal anchor tabs.

6. The multilayer electronic component of claim 5, wherein selected portions of said plurality of internal electrode elements and internal anchor tabs are diffused with material from said at least one layer of plated termination material formed thereon.

7. The multilayer electronic component of claim 6, wherein said internal electrode elements and said internal anchor tabs comprise nickel and wherein said at least one layer of plated termination material comprises copper.

8. The multilayer electronic component of claim 5, further comprising additional plated termination layers successively applied over said at least one layer of plated termination material.

9. The multilayer electronic component of claim 8, wherein said at least one layer of plated termination material comprises copper and wherein said additional plated termination layers comprise a layer of nickel and a layer of tin.

10. The multilayer electronic component of claim 5, further comprising at least one portion of activation material provided between selected exposed portions of said internal electrode elements and internal anchor tabs and said at least one layer of plated termination material.

11. The multilayer electronic component of claim 1, further comprising a plurality of external anchor tabs provided on a selected of the topmost and bottommost surfaces of the monolithic assembly.

12. The multilayer electronic component of claim 11, wherein selected of said internal electrode elements, said internal anchor tabs and said external anchor tabs comprise both a conductive material and a ceramic material.

13. The multilayer electronic component of claim 11, wherein said external anchor tabs are at least about two times the thickness of said internal anchor tabs.

14. The multilayer electronic component of claim 11, wherein said external anchor tabs are characterized by a thickness of greater than about five microns.

15. The multilayer electronic component of claim 11, wherein the exposed portions of said plurality of internal electrode elements, the exposed portions of said plurality of internal anchor tabs and said plurality of external anchor tabs are aligned in one or more columns at selected peripheral portions of the multilayer electronic component, and wherein said multilayer electronic component further comprises at least one layer of plated termination material formed along the exposed portions of said internal electrode elements and internal anchor tabs such that said at least one layer of plated termination material extends from the topmost layer of said monolithic assembly to the bottommost layer of said monolithic assembly and wraps around to selected of the topmost and bottommost surfaces of the monolithic assembly.

16. The multilayer electronic component of claim 11, wherein said external anchor tabs are embedded in selected of said topmost and bottommost surfaces of said monolithic assembly.

17. The multilayer electronic component of claim 1, wherein selected of said internal electrode elements and said internal anchor tabs are characterized by respective thicknesses of less than about two microns.

18. The multilayer electronic component of claim 1, wherein said plurality of internal electrode elements are configured in one of a generally rectangular configuration, a generally J-shaped configuration, a generally U-shaped configuration, and a generally T-shaped configuration.

19. The multilayer electronic component of claim 1, wherein said plurality of internal electrode elements are configured in a generally interdigitated configuration with multiple electrode tab portions extending from one or more selected sides of selected internal electrode elements such that the electrode tab portions are exposed at a predetermined number of multiple aligned columns at peripheral locations on the multilayer electronic component.

20. The multilayer electronic component of claim 19, wherein said predetermined number of multiple aligned columns is in a range of four (4) to forty (40).

21. The multilayer electronic component of claim 19, wherein said predetermined number of multiple aligned columns is in a range of ten (10) to twenty (20).

22. The multilayer electronic component of claim 19, wherein each aligned column exposed at a given surface of said multilayer electronic component is exposed at a distance of between about ten (10) to thirty (30) mils from other aligned columns exposed at said given surface.

23. The multilayer electronic component of claim 19, further comprising plated terminations applied over selected of said multiple aligned columns of exposed electrode tab portions.

24. The multilayer electronic component of claim 23, further comprising thick-film terminations applied over selected of said multiple aligned columns of exposed electrode tab portions.

25. The multilayer electronic component of claim 1, wherein the edges of said multilayer component formed where said topmost and bottommost surfaces of the monolithic assembly meet the device periphery are generally rounded.

26. The multilayer electronic component of claim 1, wherein the edges of said multilayer component formed where said topmost and bottommost surfaces of the monolithic assembly meet the device periphery are angled off.

27. A multilayer electronic component, comprising:
a plurality of first dielectric layers, each first dielectric layer being delimited laterally by edges;
a plurality of internal electrode elements interleaved among selected of said plurality of first dielectric layers, wherein selected portions of said plurality of internal electrode elements extend to and are exposed along at least one edge of said plurality of first dielectric layers, said interleaved combination of electrode elements and first dielectric layers forming an active assembly characterized by respective topmost and bottommost surfaces;
a plurality of second dielectric layers delimited laterally by edges and respectively provided on selected of the topmost and bottommost surfaces of said active assembly to form at least one cover layer for the multilayer electronic component, said active assembly and said at least one cover layer forming a monolithic component assembly characterized by respective topmost and bottommost surfaces; and a plurality of internal anchor tabs interleaved among selected of said first and second dielectric layers and exposed along selected edges thereof; and wherein the exposed portions of said plurality of internal electrode elements and the exposed portions of said plurality of internal anchor tabs are aligned in one or more columns at selected edges of the multilayer electronic component.

28. The multilayer electronic component of claim 27, wherein each exposed internal electrode element portion and each exposed internal anchor tab portion aligned in a given column is exposed along the periphery of said multilayer electronic component at a distance less than about ten microns from at least one other of the exposed internal electrode element portions and exposed internal anchor tab portions in said given column.

29. The multilayer electronic component of claim 27, wherein the distance between selected adjacent internal electrode elements and internal anchor tabs is closer towards said topmost and bottommost surfaces of said monolithic component assembly than at the inner layers of said monolithic component assembly.

30. The multilayer electronic component of claim 27, further comprising at least one layer of plated termination material formed along selected of the one or more aligned columns of exposed internal electrode elements and internal anchor tabs.

31. The multilayer electronic component of claim 30, wherein selected portions of said plurality of internal electrode elements and internal anchor tabs are diffused with material from said at least one layer of plated termination material formed thereon.

32. The multilayer electronic component of claim 31, wherein said internal electrode elements and said internal anchor tabs comprise nickel and wherein said at least one layer of plated termination material comprises copper.

33. The multilayer electronic component of claim 30, further comprising additional plated termination layers successively applied over said at least one layer of plated termination material.

34. The multilayer electronic component of claim 33, wherein said at least one layer of plated termination material comprises copper and wherein said additional plated termination layers comprise a layer of nickel and a layer of tin.

35. The multilayer electronic component of claim 30, further comprising at least one portion of activation material provided between selected exposed portions of said internal electrode elements and internal anchor tabs and said at least one layer of plated termination material.

36. The multilayer electronic component of claim 27, further comprising a plurality of external anchor tabs provided on a selected of the topmost and bottommost surfaces of the monolithic component assembly.

37. The multilayer electronic component of claim 36, wherein selected of said internal electrode elements, said internal anchor tabs and said external anchor tabs comprise both a conductive material and a ceramic material.

38. The multilayer electronic component of claim 36, wherein said external anchor tabs are at least about two times the thickness of said internal anchor tabs.

39. The multilayer electronic component of claim 36, wherein said external anchor tabs are characterized by a thickness of greater than about five microns.

40. The multilayer electronic component of claim 36, wherein the exposed portions of said plurality of internal electrode elements, the exposed portions of said plurality of internal anchor tabs and said plurality of external anchor tabs are aligned in one or more columns at selected edges of the multilayer electronic component, and wherein said multilayer electronic component further comprises at least one layer of plated termination material formed along the exposed portions of said internal electrode elements and internal anchor tabs such that said at least one layer of plated termination material extends from the topmost layer of said monolithic component assembly to the bottommost layer of said monolithic component assembly and wraps around to selected of the topmost and bottommost surfaces of the monolithic component assembly.

41. The multilayer electronic component of claim 40, wherein said external anchor tabs are embedded in selected of said topmost and bottommost surfaces of said monolithic component assembly.

42. The multilayer electronic component of claim 27, wherein selected of said internal electrode elements and said internal anchor tabs are characterized by respective thicknesses of less than about two microns.

43. The multilayer electronic component of claim 27, wherein said plurality of internal electrode elements are configured in one of a generally rectangular configuration, a generally J-shaped configuration, a generally U-shaped configuration, and a generally T-shaped configuration.

44. The multilayer electronic component of claim 27, wherein said plurality of internal electrode elements are configured in a generally interdigitated configuration with multiple electrode tab portions extending from one or more selected sides of selected internal electrode elements such that the electrode tab portions are exposed at a predetermined number of multiple aligned columns at peripheral locations on the multilayer electronic component.

45. The multilayer electronic component of claim 44, wherein said predetermined number of multiple aligned columns is in a range of four (4) to forty (40).

46. The multilayer electronic component of claim 44, wherein said predetermined number of multiple aligned columns is in a range of ten (10) to twenty (20).

47. The multilayer electronic component of claim 44, wherein each aligned column exposed at a given surface of said multilayer electronic component is exposed at a distance of between about ten (10) to thirty (30) mils from other aligned columns exposed at said given surface.

48. The multilayer electronic component of claim 44, further comprising plated terminations applied over selected of said multiple aligned columns of exposed electrode tab portions.

49. The multilayer electronic component of claim 48, further comprising thick-film terminations applied over selected of said multiple aligned columns of exposed electrode tab portions.

50. The multilayer electronic component of claim 27, wherein the edges of said multilayer component formed where said topmost and bottommost surfaces of the monolithic assembly meet the device periphery are generally rounded.

51. The multilayer electronic component of claim 27, wherein the edges of said multilayer component formed where said topmost and bottommost surfaces of the monolithic assembly meet the device periphery are angled off.

52. The multilayer electronic component of claim 27, wherein at least one internal anchor tab is provided in the same plane as each of said internal electrode elements.

53. The multilayer electronic component of claim 27, wherein said at least one cover layer is less than about two mils.

54. The multilayer electronic component of claim 27, wherein said plurality of internal electrode elements comprise capacitor electrodes of opposing first and second polarities, and wherein the exposed portions of said plurality of internal electrode elements and the exposed portions of said internal anchor tabs aligned in one or more columns are aligned in at least one column including capacitor electrodes of the first polarity and at least one column of capacitor electrodes of the second polarity.

55. The multilayer electronic component of claim 54, wherein each exposed internal anchor tab in the at least one aligned column including capacitor electrodes of the first polarity is not in the same vertical plane as any capacitor electrode of the second polarity, and wherein each exposed internal anchor tab in the at least one aligned column including capacitor electrodes of the second polarity is not in the same vertical plane as any capacitor electrode of the first polarity.

56. The multilayer electronic component of claim 54, further comprising:
an additional plurality of capacitor electrodes of said first polarity interleaved among selected of said plurality of second ceramic layers to form a first cover layer for said multilayer electronic component; and
an additional plurality of capacitor electrodes of said second polarity interleaved among selected of said plurality of second ceramic layers to form a second cover layer for said multilayer electronic component.

57. The multilayer electronic component of claim 27, wherein the exposed portions of said plurality of internal electrode elements and said plurality of internal anchor tabs aligned in one or more columns are aligned in at least two columns that generally extend along the entire height of said monolithic component assembly such that uppermost and lower most exposed portions in said at least two columns are within a distance of about two mils from respective topmost and bottommost surfaces of said monolithic component assembly.

58. A multilayer capacitor, comprising:
a plurality of dielectric layers, a plurality of first conductive elements, and a plurality of second conductive elements, said respective pluralities of first conductive elements and second conductive elements interleaved among said plurality of dielectric layers, wherein selected portions of selected first and second conductive elements are configured as opposing capacitor plates of respective first and second polarity;
wherein the interleaved assembly of dielectric layers, first conductive elements and second conductive elements forms a structure generally shaped as a rectangular prism characterized by opposing top and bottom surfaces and four side surfaces therebetween;
wherein each of said first and second conductive elements is exposed at at least two adjacent side surfaces of said multilayer capacitor; and
wherein each respective said plurality of first conductive elements and second conductive elements comprises a plurality of generally T-shaped capacitor electrodes and a plurality of generally rectangular anchor electrodes.

59. The multilayer capacitor of claim 58, wherein said plurality of first conductive elements, including multiple T-shaped capacitor electrodes and multiple rectangular anchor electrodes are exposed along the periphery of said multilayer capacitor in one or more aligned columns, and wherein each first conductive element in said one or more aligned columns is exposed along an entire selected side surface of said multilayer capacitor and at a portion of the two side surfaces adjacent to said selected side surface; and
wherein said plurality of second conductive elements, including multiple T-shaped capacitor electrodes and multiple rectangular anchor electrodes are exposed along the periphery of said multilayer capacitor in one or more aligned columns, and wherein each second conductive element in said one or more aligned columns is exposed along the entire side surface opposing said selected side surface along which each first conductive element is exposed along and at a portion of the two side surfaces adjacent to such opposing side surface.

60. The multilayer capacitor of claim 59, further comprising a plated termination formed at each of said one or more aligned columns of exposed first conductive elements and at each of said one or more aligned columns of second conductive elements.

61. The multilayer capacitor of claim 59, wherein both said side surfaces adjacent to said selected side surface are equally configured for mounting said multilayer capacitor to a substrate.

62. The multilayer capacitor of claim 59, wherein each exposed first conductive element aligned in a given column of said one or more aligned columns is exposed along the periphery of said multilayer capacitor at a distance less than about ten microns from at least one other of the exposed first conductive elements in said given column, and wherein each exposed second conductive element aligned in a given column of said one or more given columns is exposed along the periphery of said multilayer capacitor at a distance less than about ten microns from at least one other of the exposed second conductive elements in said given column.

63. The multilayer capacitor of claim 59, wherein each generally T-shaped capacitor electrode of said plurality of first conductive elements is provided in the same plane as at least one generally rectangular anchor electrode of the plurality of second conductive elements, and where each generally T-shaped capacitor electrode of said plurality of second conductive elements is provided in the same plane as at least one generally rectangular anchor electrode of the plurality of first conductive elements.

64. The multilayer capacitor of claim 58, wherein the edges of said multilayer capacitor formed where said opposing top and bottom surfaces meet each of said four side surfaces are generally rounded.

65. A multilayer capacitor, comprising:
a plurality of dielectric layers, a plurality of first conductive elements, and a plurality of second conductive elements, said respective pluralities of first conductive elements and second conductive elements interleaved among said plurality of dielectric layers, wherein selected portions of selected first and second conductive elements are configured as opposing capacitor plates of respective first and second polarity;
wherein the interleaved assembly of dielectric layers, first conductive elements and second conductive elements forms a structure generally shaped as a rectangular prism characterized by opposing top and bottom surfaces and four side surfaces therebetween;
wherein each of said first and second conductive elements is exposed at at least two adjacent side surfaces of said multilayer capacitor: and
wherein each of said first and second conductive elements comprises a generally rectangular shaped base portion with first and second generally rectangular tab portions extending from opposing corners of said generally rectangular shaped base portion.

66. The multilayer capacitor of claim 65, wherein each generally rectangular tab portion of said plurality of first conductive elements is exposed along the periphery of said multilayer capacitor in one or more aligned columns, and wherein each generally rectangular tab portion of each first conductive element in said one or more aligned columns is exposed at a component edge formed where two adjacent side surfaces of the multilayer capacitor come together; and wherein each generally rectangular tab portion of said plurality of second conductive elements is exposed along the periphery of said multilayer capacitor in one or more aligned columns, and wherein each generally rectangular tab portion of each second conductive element in said one or more aligned columns is exposed at a component edge formed where two adjacent side surfaces of the multilayer capacitor come together.

67. The multilayer capacitor of claim 66, further comprising a plated termination formed at each of said one or more aligned columns of exposed first conductive elements and at each of said one or more aligned columns of second conductive elements.

68. The multilayer capacitor of claim 65, wherein each first generally rectangular tab portion of each first conductive element is exposed along the periphery of said multilayer capacitor at an edge defined by first and second selected adjacent side surfaces, wherein each second rectangular tab portion of said first conductive element is exposed at the edge defined by the other two of said side surfaces, wherein each first generally rectangular tab portion of each second conductive element is exposed along the periphery of said multilayer capacitor at an edge defined by one of said first and second selected adjacent side surfaces and an adjacent one of said other two side surfaces, and wherein each second generally rectangular tab portion of each second conductive element is exposed at the edge defined by the other of said first and second selected side surfaces and the adjacent other of said other two side surfaces.

69. The multilayer capacitor of claim 65, wherein each of said four sides of said multilayer capacitor is equally configured for mounting said multilayer capacitor to a substrate.

70. The multilayer capacitor of claim 65, wherein each exposed first conductive element aligned in a given column of said one or more aligned columns is exposed along the periphery of said multilayer capacitor at a distance less than about ten microns from at least one other of the exposed first conductive elements in said given column, and wherein each exposed second conductive element aligned in a given column of said one or more given columns is exposed along the periphery of said multilayer capacitor at a distance less than about ten microns from at least one other of the exposed second conductive elements in said given column.

71. The multilayer capacitor of claim 65, wherein the edges of said multilayer component formed where said opposing top and bottom surfaces meet each of said four side surfaces are generally rounded.

* * * * *